United States Patent
Kuo et al.

(10) Patent No.: US 11,646,259 B2
(45) Date of Patent: May 9, 2023

(54) REDISTRIBUTION STRUCTURE AND FORMING METHOD THEREOF

(71) Applicant: Industrial Technology Research Institute, Hsinchu (TW)

(72) Inventors: Shu-Wei Kuo, Hsinchu County (TW); Chen-Tsai Yang, Taoyuan (TW); Wei-Yuan Cheng, Hsinchu County (TW); Chien-Hsun Chu, Kaohsiung (TW); Shau-Fei Cheng, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/159,012

(22) Filed: Jan. 26, 2021

(65) Prior Publication Data

US 2022/0130744 A1    Apr. 28, 2022

(30) Foreign Application Priority Data

Oct. 27, 2020 (TW) ................................ 109137313

(51) Int. Cl.
*H01L 23/498* (2006.01)
*H01L 23/00* (2006.01)
(Continued)

(52) U.S. Cl.
CPC .... *H01L 23/49838* (2013.01); *H01L 21/4857* (2013.01); *H01L 23/3121* (2013.01);
(Continued)

(58) Field of Classification Search
None
See application file for complete search history.

(56) References Cited

U.S. PATENT DOCUMENTS 6,706,166 B2    3/2004  Chou et al.
6,890,413 B2    5/2005  Cheng et al.
(Continued)

FOREIGN PATENT DOCUMENTS

CN    103619125    8/2016
EP    3287550    2/2018
(Continued)

OTHER PUBLICATIONS

"Office Action of Taiwan Counterpart Application", dated Dec. 23, 2020, p. 1-p. 6.

*Primary Examiner* — Long Pham
(74) *Attorney, Agent, or Firm* — JCIPRNET

(57) ABSTRACT

Provided is a forming method of a redistribution structure including: forming a first redistribution layer and a first compensation circuit layer on a substrate, wherein the first compensation circuit layer surrounds the first redistribution layer, and the first compensation circuit layer and the first redistribution layer are electrically insulated from each other; forming a first dielectric layer on the first redistribution layer and the first compensation circuit layer; and forming a second redistribution layer and a second compensation circuit layer on the first dielectric layer, wherein the second compensation circuit layer surrounds the second redistribution layer, the second compensation circuit layer and the second redistribution layer are electrically insulated from each other, the second compensation circuit layer is connected to the first compensation circuit layer, and the second redistribution layer is connected to the first redistribution layer.

15 Claims, 18 Drawing Sheets

(51) Int. Cl.
*H01L 23/31* (2006.01)
*H01L 21/48* (2006.01)

(52) U.S. Cl.
CPC .... *H01L 23/3135* (2013.01); *H01L 23/49822* (2013.01); *H01L 24/16* (2013.01); *H01L 2224/16227* (2013.01); *H01L 2924/18161* (2013.01)

(56) References Cited

U.S. PATENT DOCUMENTS

| | | | |
|---|---|---|---|
| 7,803,257 | B2 | 9/2010 | Chang et al. |
| 7,935,240 | B2 | 5/2011 | Singh et al. |
| 8,475,644 | B2 | 7/2013 | Mayer et al. |
| 9,309,604 | B2 | 4/2016 | Mayer et al. |
| 9,534,310 | B2 | 1/2017 | Rauenbusch et al. |
| 10,504,858 | B2 * | 12/2019 | Chen .................... H01L 21/6835 |
| 2003/0168340 | A1 | 9/2003 | Kaja et al. |
| 2005/0189228 | A1 | 9/2005 | Huang |
| 2018/0330966 | A1 | 11/2018 | Scanlan et al. |
| 2019/0096796 | A1 | 3/2019 | Lin et al. |
| 2019/0103387 | A1 | 4/2019 | Tsou et al. |
| 2020/0118953 | A1 * | 4/2020 | Yu ........................ H01L 23/3128 |

FOREIGN PATENT DOCUMENTS

| | | |
|---|---|---|
| TW | I473914 | 2/2015 |
| TW | 202009331 | 3/2020 |

* cited by examiner

REDISTRIBUTION STRUCTURE AND FORMING METHOD THEREOF

CROSS-REFERENCE TO RELATED APPLICATION

This application claims the priority benefit of Taiwan application serial no. 109137313, filed on Oct. 27, 2020. The entirety of the above-mentioned patent application is hereby incorporated by reference herein.

TECHNICAL FIELD

The disclosure relates to a package and a forming method thereof, and relates to a redistribution structure and a forming method thereof.

BACKGROUND

The redistribution layer (RDL) is a key part of packaging. The conductive layer of the RDL is usually formed by electroplating. However, when the size of the wafer or the substrate is increased, the issue of uneven thickness often occurs to the conductive layer in the central region and the edge region.

SUMMARY

Embodiments of the disclosure provide a redistribution layer and a forming method thereof that may alleviate the issue of uneven coating thickness in a large area.

An embodiment of the disclosure provides a forming method of a redistribution structure including: forming a first redistribution layer and a first compensation circuit layer on a substrate, wherein the first compensation circuit layer surrounds the first redistribution layer, and the first compensation circuit layer and the first redistribution layer are electrically insulated from each other; forming a first dielectric layer on the first redistribution layer and the first compensation circuit layer; and forming a second redistribution layer and a second compensation circuit layer on the first dielectric layer, wherein the second compensation circuit layer surrounds the second redistribution layer, the second compensation circuit layer and the second redistribution layer are electrically insulated from each other, the second compensation circuit layer is connected to the first compensation circuit layer, and the second redistribution layer is connected to the first redistribution layer.

An embodiment of the disclosure provides a redistribution structure including: a first redistribution layer and a first compensation circuit layer electrically insulated from each other, wherein the first compensation circuit layer surrounds the first redistribution layer; a first dielectric layer disposed on the first redistribution layer and the first compensation circuit layer; and a second redistribution layer and a second compensation circuit layer electrically insulated from each other and disposed on the first dielectric layer, wherein the second compensation circuit layer surrounds the second redistribution layer, the second compensation circuit layer is connected to the first compensation circuit layer, and the second redistribution layer is connected to the first redistribution layer.

Based on the above, the embodiments of the disclosure may solve the issue of uneven coating thickness distribution in a large area by providing a compensation circuit layer.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2I' is a cross-sectional view of a redistribution structure according to another embodiment of the disclosure.

DETAILED DESCRIPTION OF DISCLOSED EMBODIMENTS

An embodiment of the disclosure provides a forming method of a redistribution structure RDLS, including: providing a sample 100. The sample 100 includes a substrate 10. The substrate 10 may be a quadrangle temporary substrate, such as glass, as shown in FIG. 1A, FIG. 1C, FIG. 1D, and FIG. 1E. The substrate 10 may also be a wafer, as shown in FIG. 1B. The substrate 10 includes a plurality of packaging units P. The plurality of packaging units P may also be referred to as units to be electroplated.

Figure 1A:
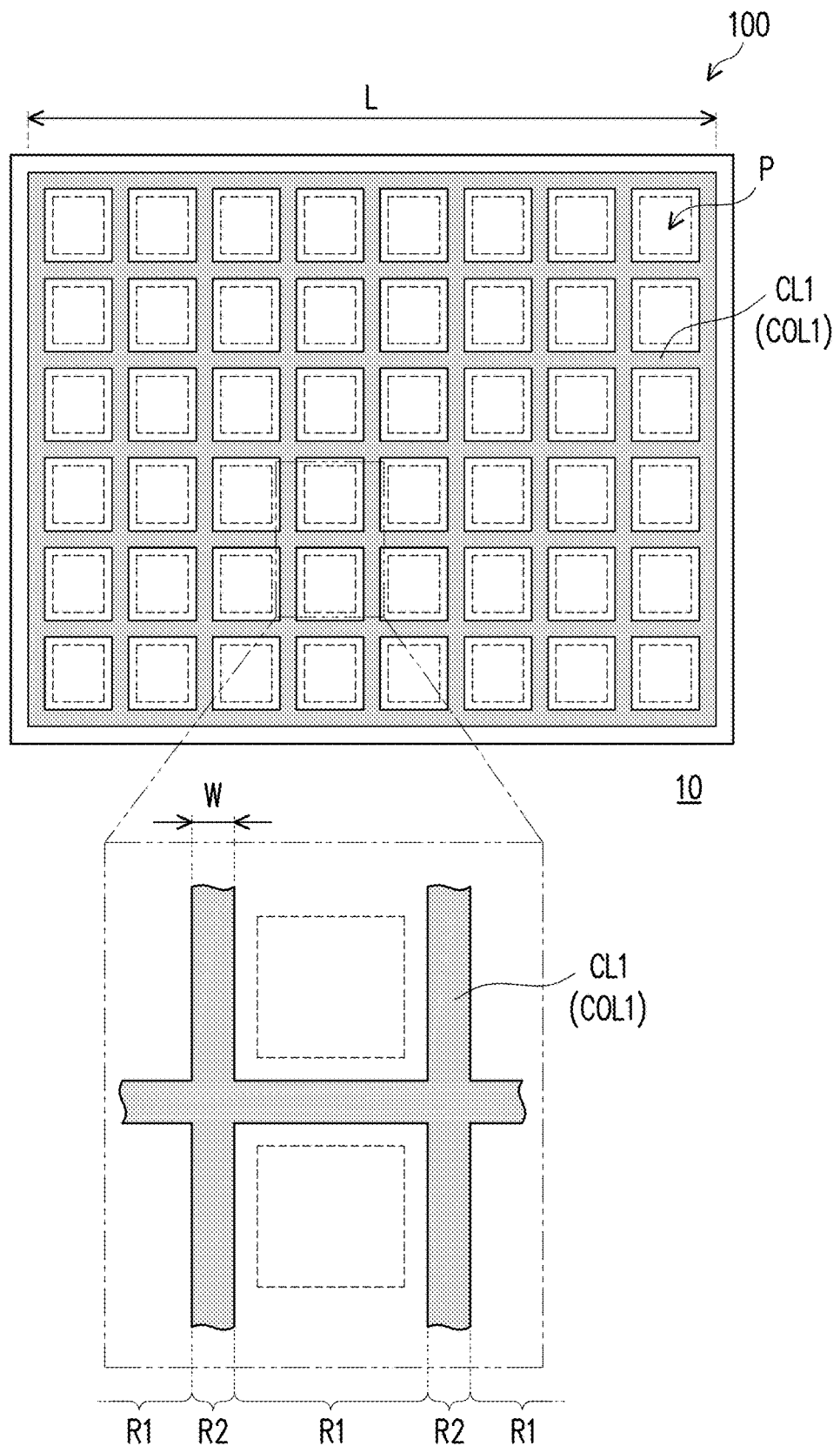
FIG. 1A to FIG. 1D are top views of several samples having a compensation circuit layer according to embodiments of the disclosure.
Figure 1B:
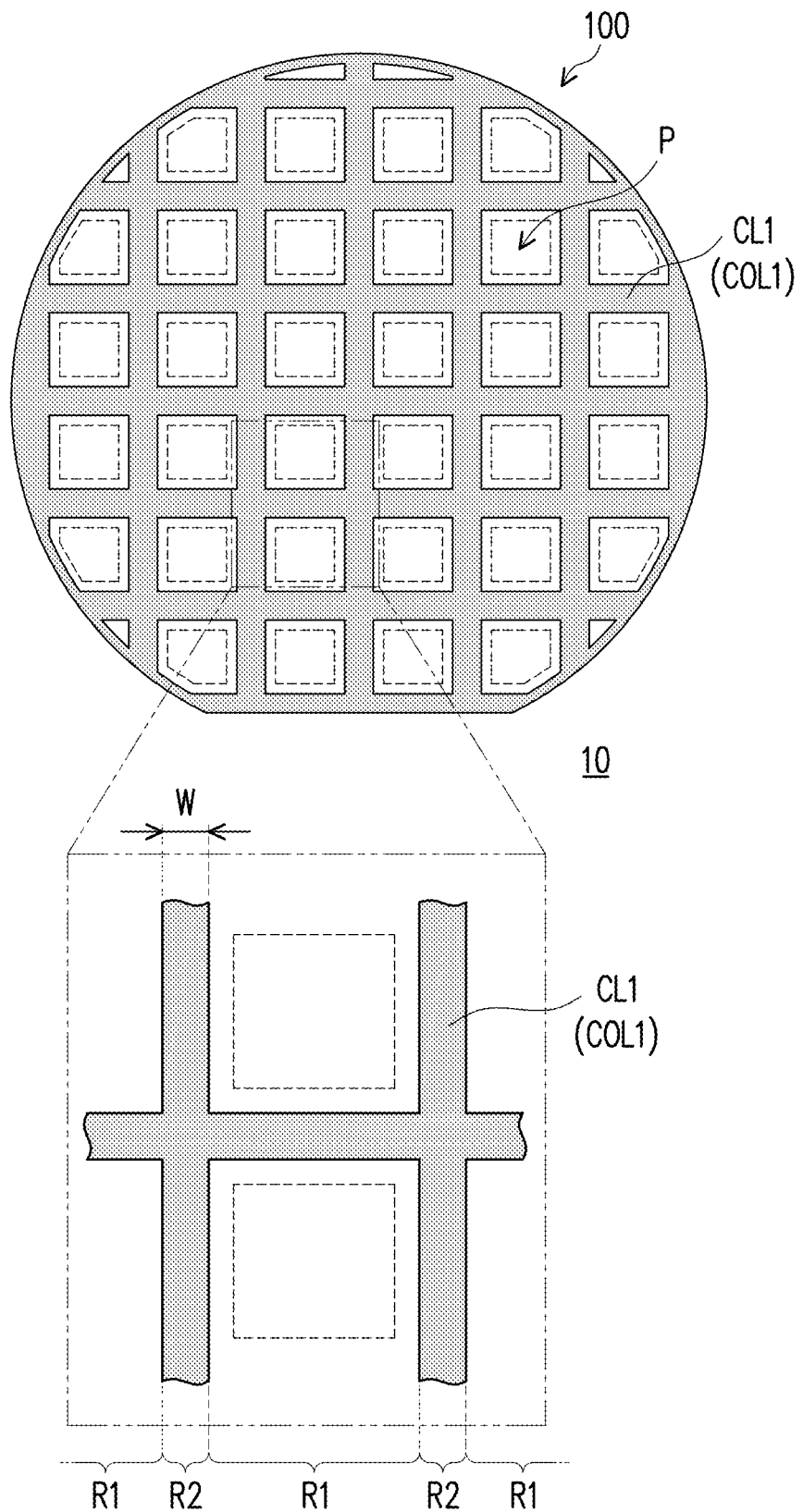
Figure 1C:
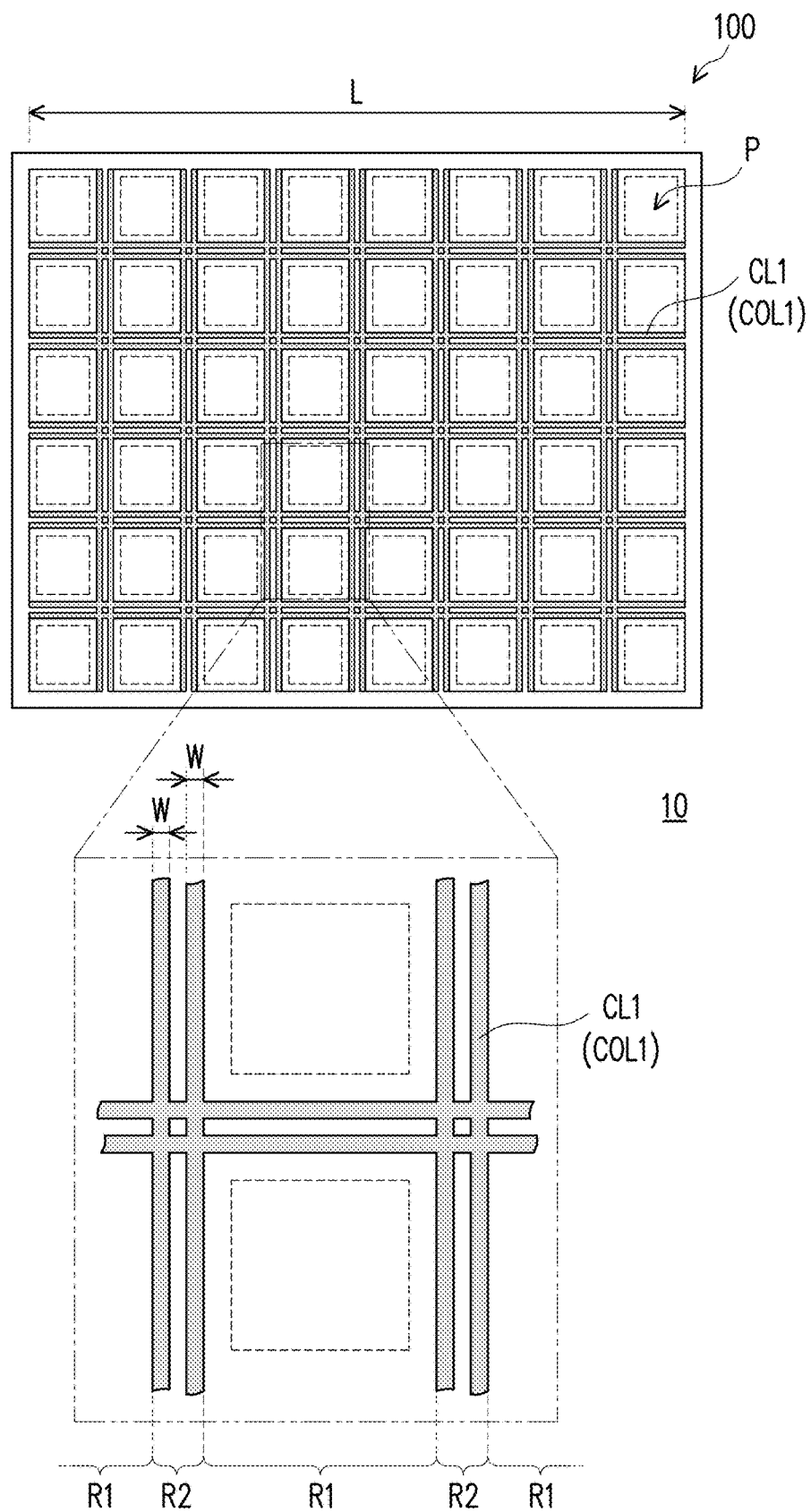
Figure 1D:
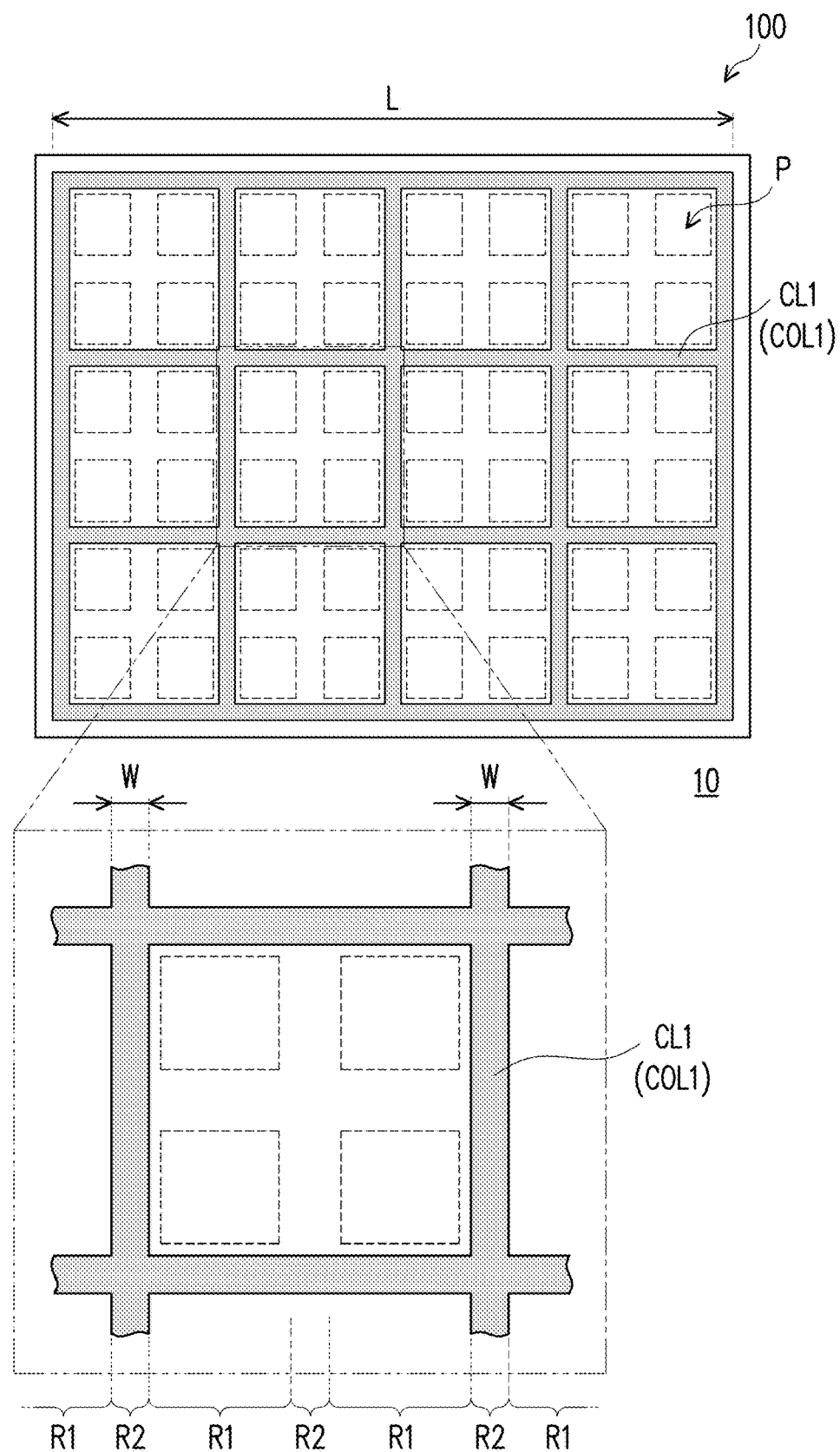
Figure 1E:
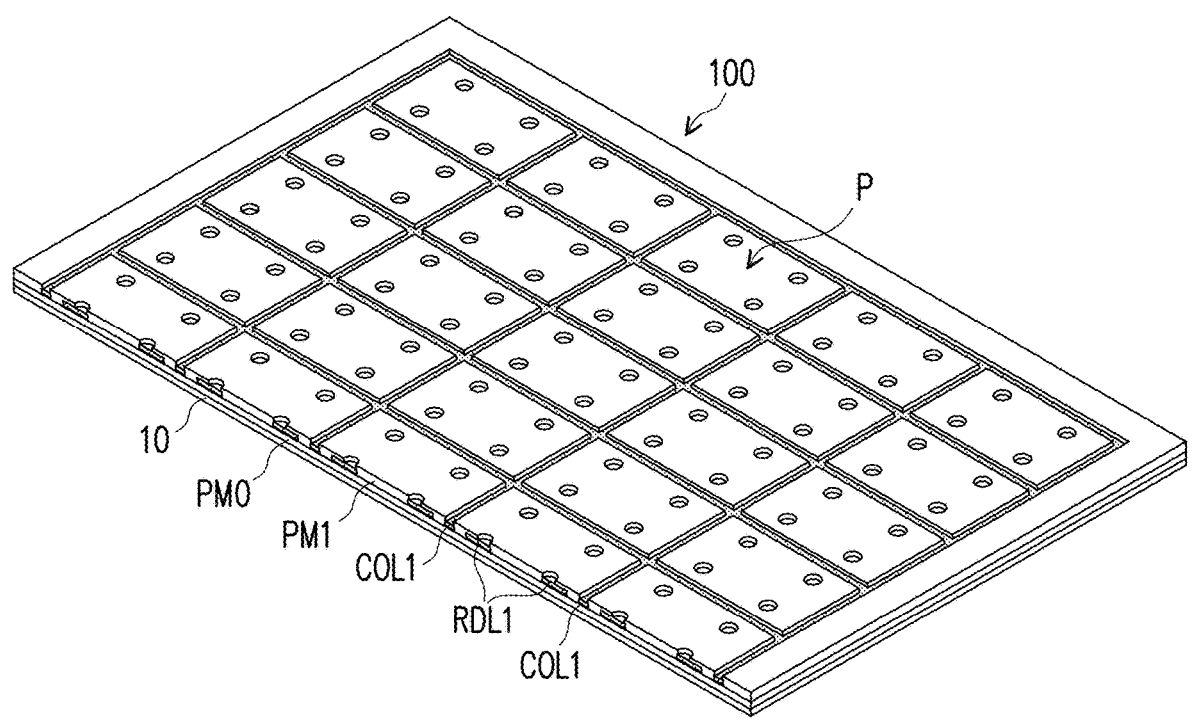
FIG. 1E is a perspective view of FIG. 1A.
Figure 2A:
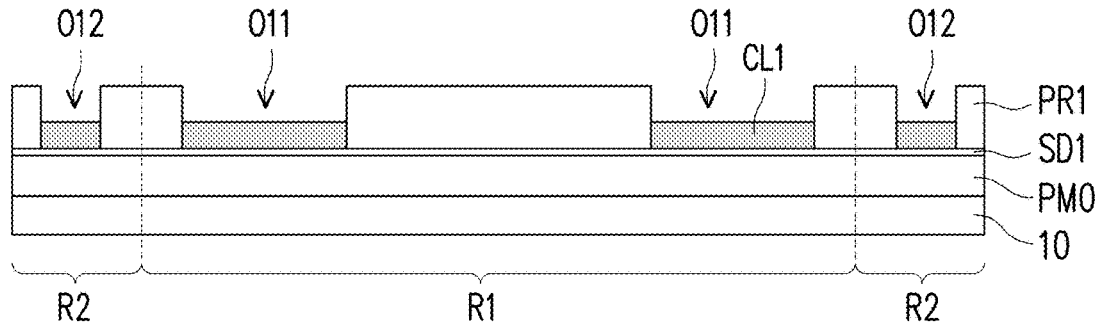
FIG. 2A to FIG. 2I are cross-sectional views of a forming method of a redistribution structure according to an embodiment of the disclosure.

Referring to FIG. 1A, FIG. 1E, and FIG. 2A, each of the packaging units P includes a region R1 and a region R2. The region R2 is adjacent to the region R1. In some embodiments, the region R1 is, for example, a die region; and the region R2 is, for example, a cutting region. In some other embodiments, the region R1 is, for example, a die region; and the region R2 is, for example, a die region adjacent to a cutting region and not extended to the cutting region. In still some embodiments, the region R1 is, for example, a die region; and the region R2 is, for example, a die region adjacent to a cutting region and extended to the cutting region. Next, a dielectric layer PM0 is formed on the substrate 10. The dielectric layer PM0 may be a polymer, such as polyimide (PI). The forming method of the dielectric layer PM0 is, for example, a spin coating method.

Then, referring to FIG. 1A, FIG. 1E, FIG. 2A, and FIG. 2B, a first layer structure T1 is formed on the dielectric layer PM0. The first layer structure T1 includes a redistribution layer RDL1, a compensation circuit layer COL1, and a dielectric layer PM1. For clarity, FIG. 1A and FIG. 1B show the compensation circuit layer COL1 but do not show the redistribution layer RDL1 and the dielectric layer PM1. The forming method of the first layer structure T1 is as follows.

Referring to FIG. 2A, a seed layer SD1 is formed on the dielectric layer PM0. The seed layer SD1 is a continuous layer extended from the region R1 to the region R2. The seed layer SD1 may be a single layer or a plurality of layers, such as a titanium/copper layer. The forming method of the seed layer SD1 is, for example, a sputtering method. Next, a patterned mask layer PR1 is formed on the seed layer SD1. The patterned mask layer PR1 is, for example, a patterned photoresist layer. The patterned mask layer PR1 has an opening O11 and an opening O12. The opening O11 exposes the seed layer SD1 on the region R1. The opening O12 exposes the seed layer SD1 on the region R2. Then, a conductive layer CL1 is formed on the seed layer SD1 in the opening O11 and the opening O12, respectively. The material of the conductive layer CL1 is, for example, copper or copper-aluminum alloy. The forming method of the conductive layer CL1 is, for example, an electroplating method.

Figure 2B:
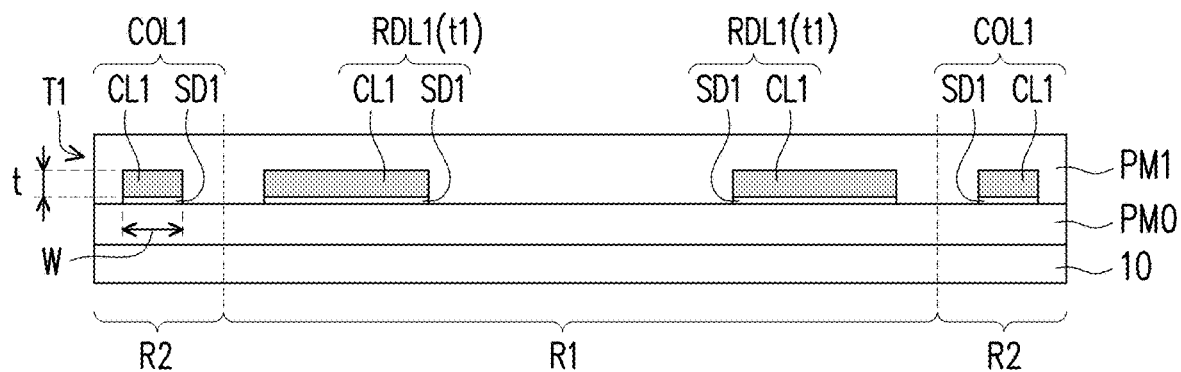

Referring to FIG. 2B, the patterned mask layer PR1 is removed. Then, the seed layer SD1 not covered by the conductive layer CL1 is removed to simultaneously form the redistribution layer RDL1 in the region R1 and form the compensation circuit layer COL1 in the region R2. Then, the dielectric layer PM1 is formed on the redistribution layer RDL1 and the compensation circuit layer COL1. The material and the forming method of the dielectric layer PM1 may be the same as or different from the dielectric layer PM0.

The redistribution layer RDL1 is a functional circuit layer including a plurality of traces t1. The length and the shape of the traces t1 are different from each other. The compensation circuit layer COL1 is a non-functional circuit layer. The compensation circuit layer COL1 is a continuous structure and is located around the redistribution layer RDL1. In an embodiment of the disclosure, the compensation circuit layer COL1 and the redistribution layer RDL1 are electrically insulated from each other. The compensation circuit layer COL1 is, for example, a continuous network structure composed of a plurality of staggered compensation circuits, as shown in FIG. 1A, FIG. 1B, FIG. 1C, FIG. 1D, and FIG. 1E. The network structure may be enclosed, as shown in FIG. 1A, FIG. 1B, FIG. 1D, and FIG. 1E. The network structure may also be not enclosed, as shown in FIG. 1C.

In FIG. 1A, FIG. 1D, and FIG. 1E, the compensation circuit layer COL1 is a network structure, and each grid has the same size or shape, that is, the compensation circuit layer COL1 has a regular pattern. The regular pattern refers to a pattern having a plurality of repeating units. The redistribution layer RDL1 (not shown) of each of the packaging units P is located in the grid of each of the network structures. However, the embodiments of the disclosure are not limited thereto. The size or the shape of each of the grids of the network structure is not limited to be the same, and the size and the shape of each of the grids of the network structure may also be different (as shown in FIG. 1C). In addition, there may be a single compensation circuit in each of the regions R2 (as shown in FIG. 1A and FIG. 2B). There may also be a plurality of compensation circuits in each of the regions R2 (as shown in FIG. 1C). In some embodiments, each of the regions R2 has a single compensation circuit, so that the redistribution layer RDL1 of each of the packaging units P is surrounded by the grid of the compensation circuit layer COL1 (as shown in FIG. 1A and FIG. 1E). However, the embodiments of the disclosure are not limited thereto. In other embodiments, a plurality of regions R2 may also have a single compensation circuit, so that a plurality of redistribution layers RDL1 of a plurality of regions R1 are surrounded by the grid of one compensation circuit layer COL1 (as shown in FIG. 1D).

Figure 2C:
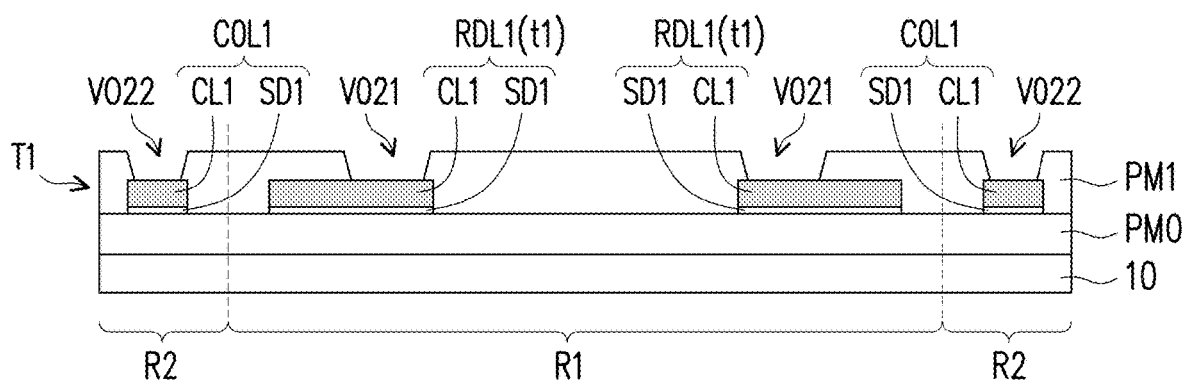
Figure 2D:
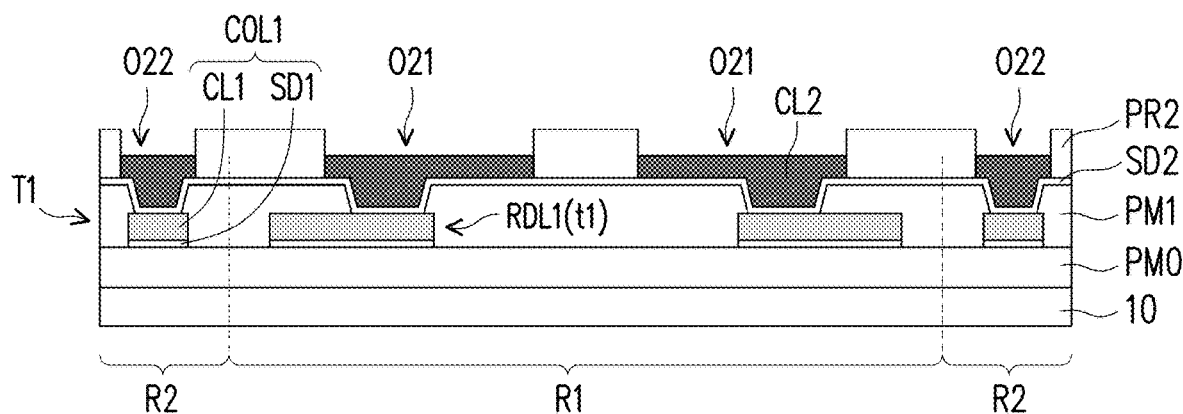
Figure 2E:
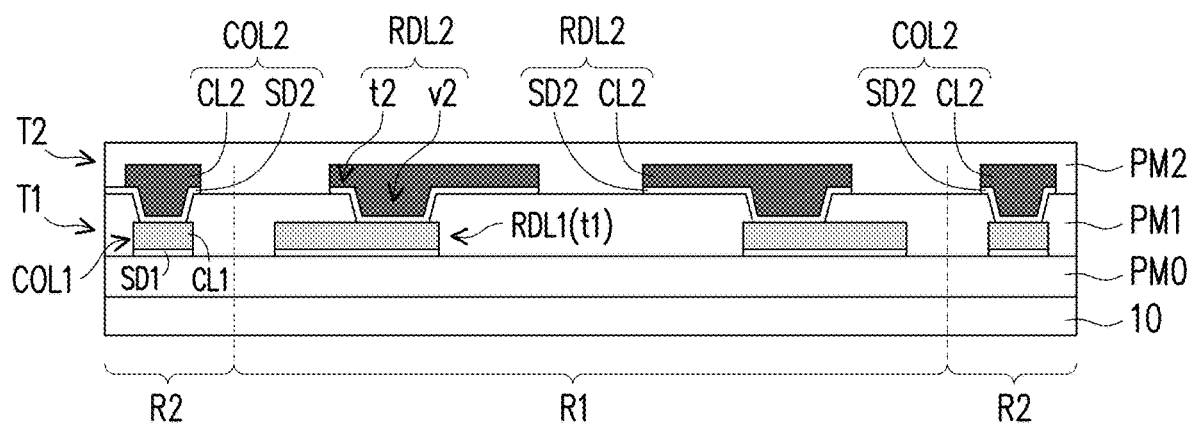

Next, referring to FIG. 2C to FIG. 2E, after the dielectric layer PM1 is formed, a second layer structure T2 is formed on the dielectric layer PM1. The second layer structure T2 includes a redistribution layer RDL2, a compensation circuit layer COL2, and a dielectric layer PM2. The forming method of the second layer structure T2 is as follows.

Referring to FIG. 2C, the dielectric layer PM1 is patterned to form via openings VO21 and VO22 in the dielectric layer PM1. In the region R1, the dielectric layer PM1 covers most of the top surface of the conductive layer CL1 of the redistribution layer RDL1; and the via opening VO21 exposes a small portion of the top surface of the conductive layer CL1 of the redistribution layer RDL1. In the region R2, the dielectric layer PM1 covers a small portion of or does not cover the top surface of the conductive layer CL1 of the compensation circuit layer COL1; and the via opening VO22 exposes most or all of the top surface of the conductive layer CL1 of the compensation circuit layer COL1. The ratio of the area of the top surface of the conductive layer CL1 of the redistribution layer RDL1 exposed by the via opening VO21 to the area of the top surface of the conductive layer CL1 of all the redistribution layers RDL1 is R21. The ratio of the area of the top surface of the conductive layer CL1 of the compensation circuit layer COL1 exposed by the via opening VO22 to the area of the top surface of the conductive layer CL1 of all the compensation circuit layers COL1 is R22. The ratio R22 is greater than the ratio R21. The ratio R21 is, for example, 1% to 49%. The ratio R22 is, for example, 50% to 100%.

Next, referring to FIG. 2D, a seed layer SD2 is formed on the dielectric layer PM1 and in the via opening VO21 and the via opening VO22. The seed layer SD2 is a continuous layer extended from the region R1 to the region R2. The seed layer SD2 may be a single layer or a plurality of layers, such as a titanium/copper layer. The shape of the seed layer SD2 at the bottom surface of the via opening VO22 may be completely the same, partially the same, or completely different from the shape of the conductive layer CL1 in the region R2. The seed layer SD2 at the bottom surface of the via opening VO22 and the conductive layer CL1 below may be overlapped completely or partially. The seed layer SD2 at the bottom surface of the via opening VO22 may be a continuous layer or a discontinuous layer. The seed layer SD2 at the bottom surface of the via opening VO22 may have a single width, a plurality of widths, or a gradient width.

FIG. 3A to FIG. 3F illustrate structures of various seed layers SD2 located at the bottom surface of the via opening VO22 with the conductive layer CL1 of the compensation circuit layer COL1 in the region R2 as a network structure, but the embodiments of the disclosure are not limited thereto.

Figure 3A:
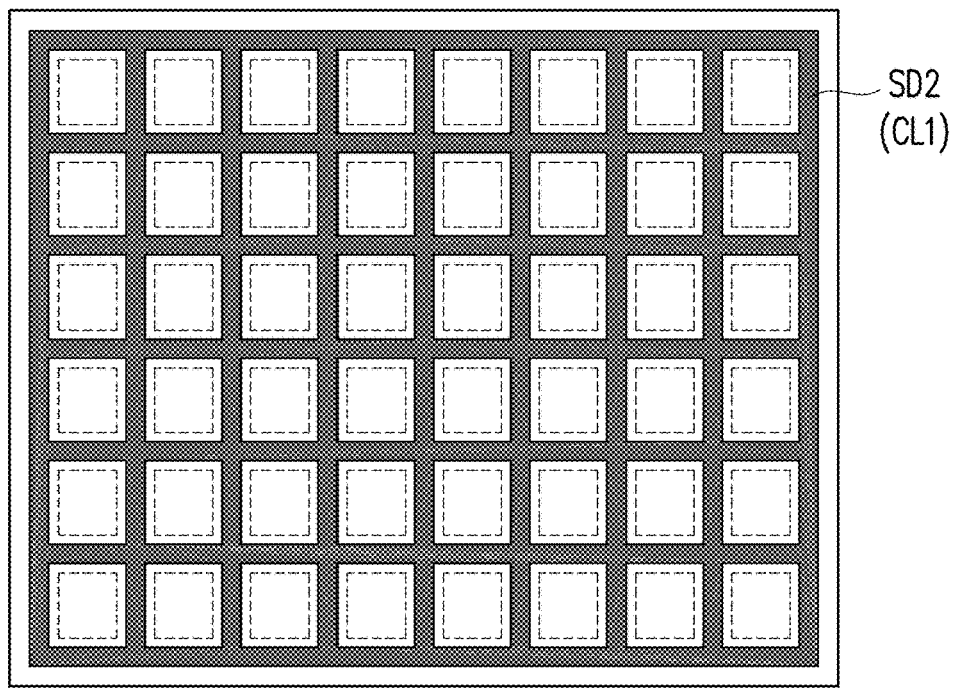
FIG. 3A to FIG. 3F are top views of several compensation circuit layers with a seed layer above according to embodiments of the disclosure.
Figure 3B:
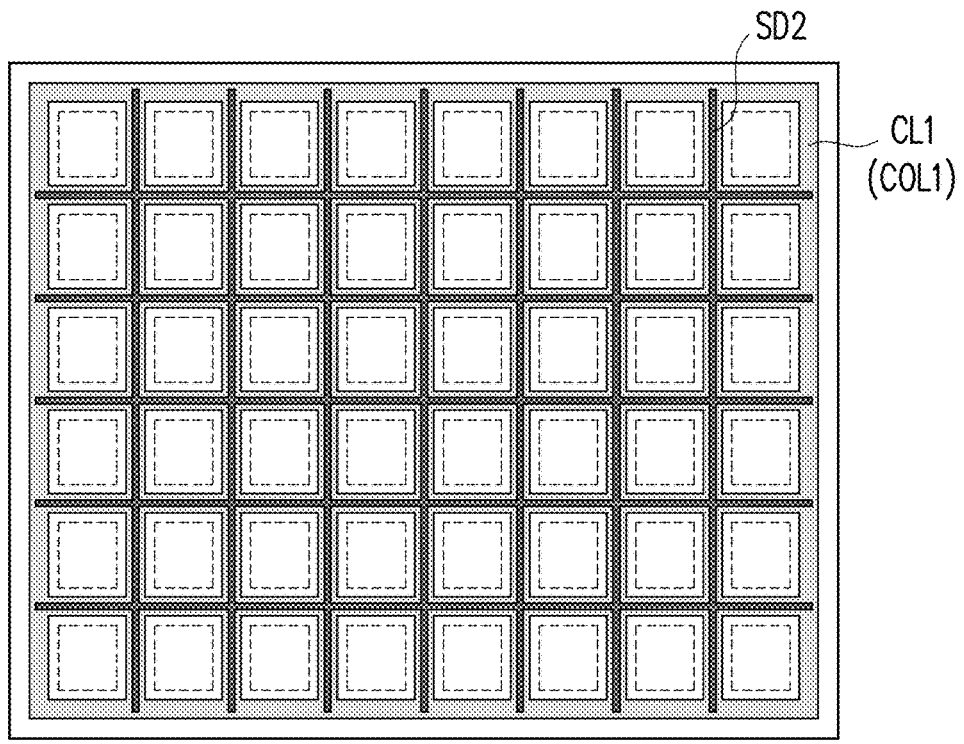
Figure 3C:
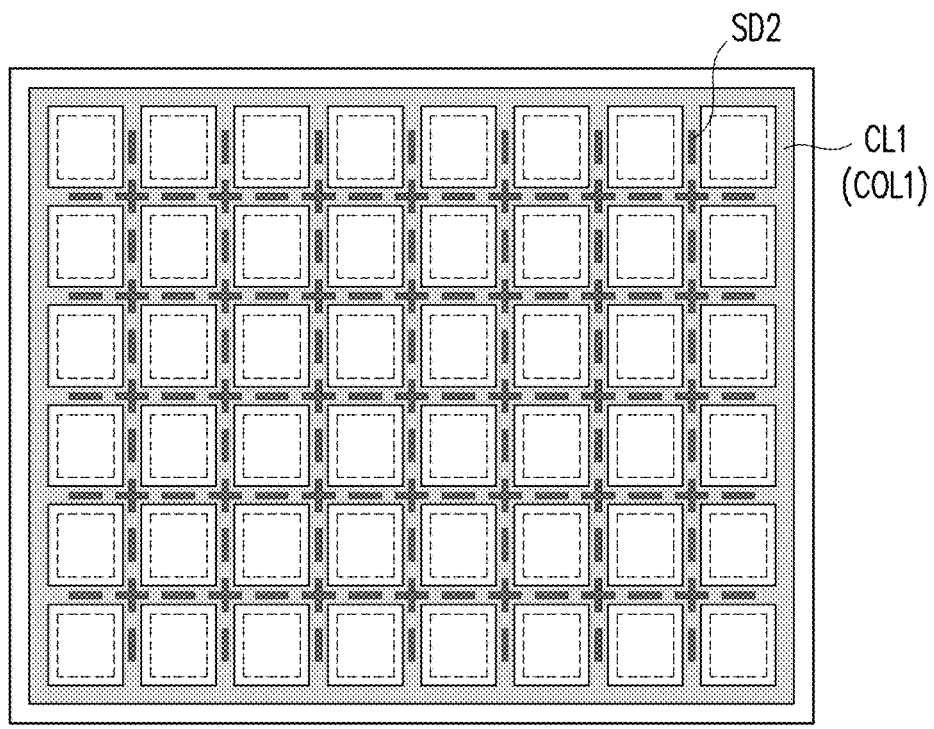
Figure 3D:
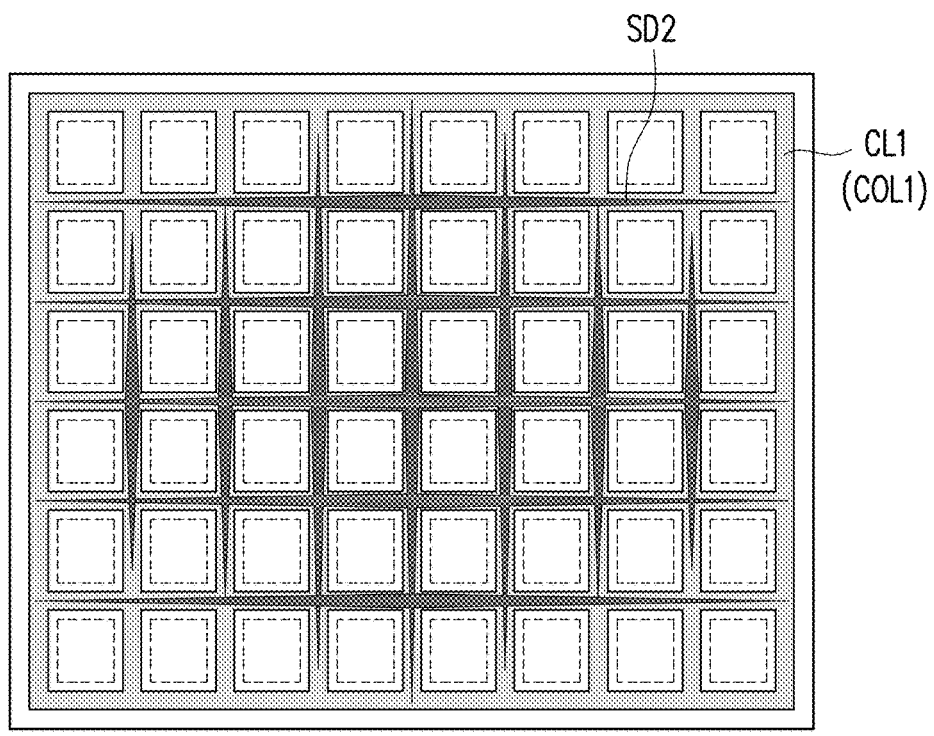
Figure 3E:
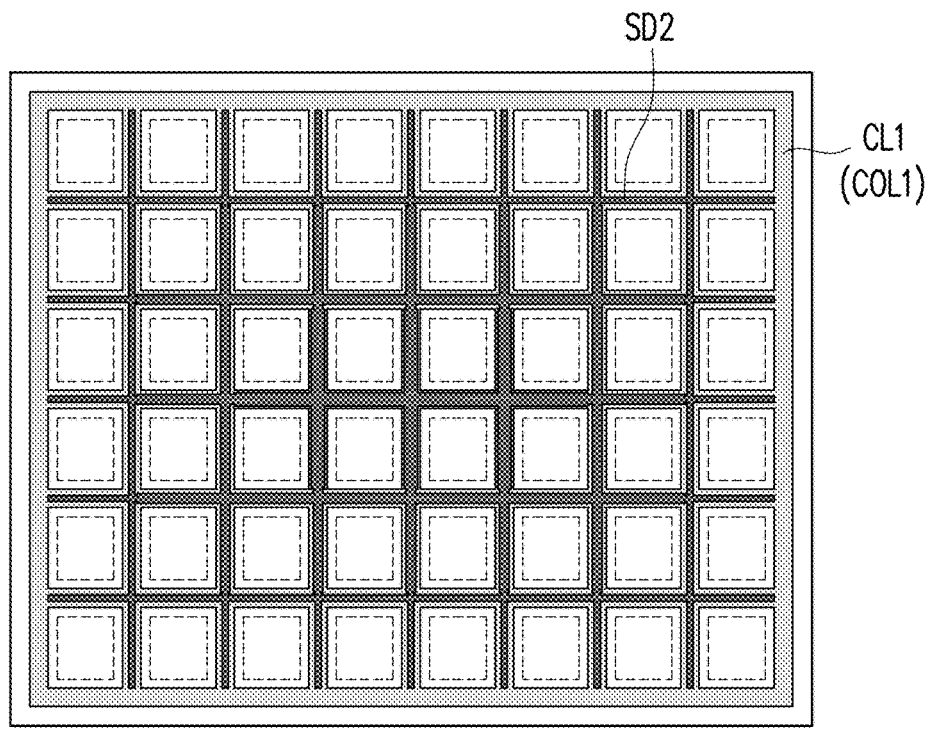
Figure 3F:
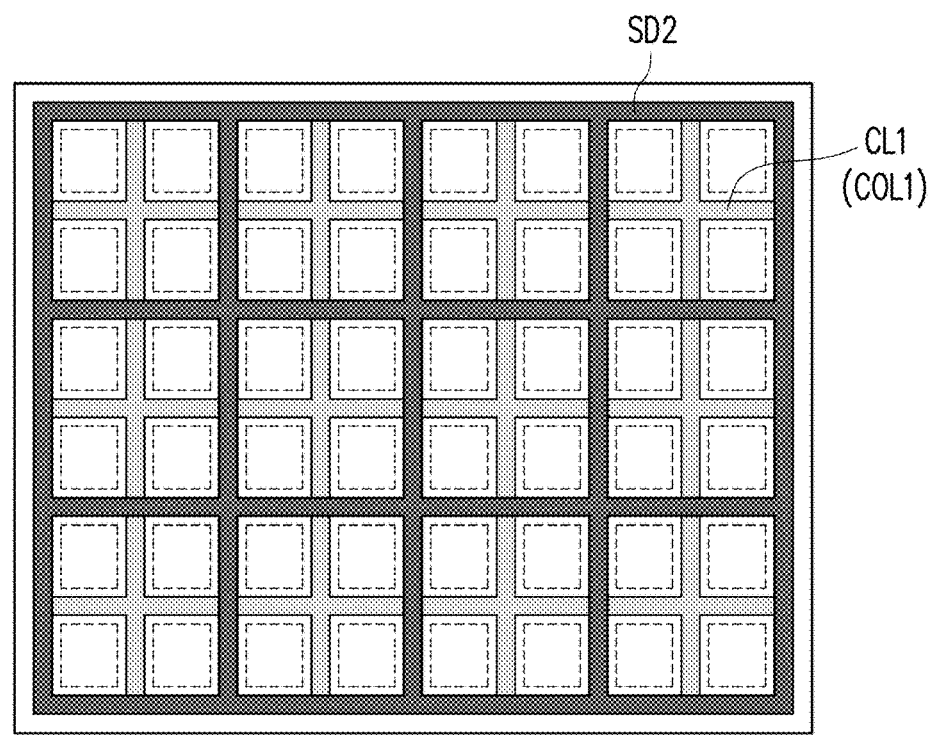

Please refer to FIG. 2C, FIG. 2D, and FIG. 3A to FIG. 3F, the seed layer SD2 at the bottom surface of the via opening VO22 may completely cover (as shown in FIG. 3A) or partially cover (as shown in FIG. 3B, FIG. 3C, FIG. 3D, FIG. 3E, and FIG. 3F) the conductive layer CL1 of the compensation circuit layer COL1. The shape of the seed layer SD2 at the bottom surface of the via opening VO22 may be exactly the same as (as shown in FIG. 3A), similar to (as shown in FIG. 3B), partially similar to (as shown in FIG. 3C and FIG. 3E), or completely different (as shown in FIG. 3D and FIG. 3F) from the shape of the conductive layer CL1 of the compensation circuit layer COL1.

The width of the seed layer SD2 at the bottom surface of the via opening VO22 may be exactly the same as (as shown in FIG. 3A and FIG. 3F), partially the same as and partially different (as shown in FIG. 3E), or completely different (as shown in FIG. 3B, FIG. 3C, and FIG. 3D) from the width of the conductive layer CL1 of the compensation circuit layer COL1. The seed layer SD2 at the bottom surface of the via opening VO22 may be a continuous layer (as shown in FIG. 3A, FIG. 3B, FIG. 3D, FIG. 3E, and FIG. 3F) or a discontinuous layer (as shown in FIG. 3C).

The seed layer SD2 at the bottom surface of the via opening VO22 may have a single width (as shown in FIG. 3A, FIG. 3B, FIG. 3C, and FIG. 3F), a plurality of widths (as shown in FIG. 3E), or a gradient width (as shown in FIG. 3D). In FIG. 3D, the width of the seed layer SD2 at the bottom surface of the via opening VO22 is gradually decreased from the center to the periphery, but is not limited thereto. In FIG. 3E, the width of the seed layer SD2 at the bottom surface of the via opening VO22 is decreased in a gradient from the center to the periphery, but is not limited thereto. The width of the seed layer SD2 at the bottom surface of the via opening VO22 may also be increased in a gradient from the center to the periphery. The width of the seed layer SD2 at the bottom surface of the via opening VO22 may also be gradually increased from the center to the periphery. The shape of the seed layer SD2 at the bottom surface of the via opening VO22 and the overlap thereof with the conductive layer CL1 below are not limited to the above.

Next, referring to FIG. 2D, after the seed layer SD2 is formed, a patterned mask layer PR2 is formed on the seed layer SD2. The patterned mask layer PR2 is, for example, a patterned photoresist layer. The patterned mask layer PR2 has an opening O21 and an opening O22. The opening O21 exposes the seed layer SD2 on the region R1. The opening O22 exposes the seed layer SD2 on the region R2. Then, a conductive layer CL2 is formed on the seed layer SD2 in the opening O21 and the opening O22, respectively. The material of the conductive layer CL2 is, for example, copper or copper-aluminum alloy. The forming method of the conductive layer CL2 is, for example, an electroplating method.

In the process of forming the conductive layer CL2, the conductive layer CL2 may be electrically connected to the compensation circuit layer COL1 below via the seed layer SD2. Since the thickness of the compensation circuit layer COL1 is greater than the thickness of the seed layer SD2 and the resistance thereof is lower than the resistance of the seed layer SD2, a greater voltage drop produced by the central region being farther from the electrode fixture and the seed layer having greater resistance may be alleviated or avoided. In other words, the compensation circuit layer COL1 may reduce the voltage difference of the sample between the central region and the edge region during the electroplating process, thereby reducing the thickness difference between the conductive layer CL2 formed in the central region and the conductive layer CL2 formed in the edge region.

Referring to FIG. 2E, the patterned mask layer PR2 is removed. Then, the seed layer SD2 not covered by the conductive layer CL2 is removed to simultaneously form the redistribution layer RDL2 in the region R1 and form the compensation circuit layer COL2 in the region R2. Then, the dielectric layer PM2 is formed on the dielectric layer PM1, the redistribution layer RDL2, and the compensation circuit layer COL2.

The redistribution layer RDL2 is a functional circuit layer including a plurality of traces t2 and a plurality of vias v2. The length and the shape of the traces t2 are different from each other. The plurality of vias v2 are connected to the traces t1 of the redistribution layer RDL1 below via the vias v2. The compensation circuit layer COL2 is a non-functional circuit layer. The compensation circuit layer COL2 is a continuous structure (such as a continuous network structure) or a discontinuous structure (such as a discontinuous network structure), and is located around the redistribution layer RDL2 and electrically insulated from the redistribution layer RDL2 and the redistribution layer RDL1. The ratio of the bottom surface of the compensation circuit layer COL2 in contact with and overlapped with the top surface of the compensation circuit layer COL1 is greater than the ratio of the bottom surface of the redistribution layer RDL2 in contact with and overlapped with the top surface of the redistribution layer RDL1. In some embodiments, the ratio of the bottom surface of the compensation circuit layer COL2 in contact with and overlapped with the top surface of the compensation circuit layer COL1 is 50% to 100%.

Then, referring to FIG. 2F to FIG. 2I, pads CP electrically connected to the redistribution layer RDL2 are formed on the dielectric layer PM2. The forming method of the pads CP is as follows.

Figure 2F:
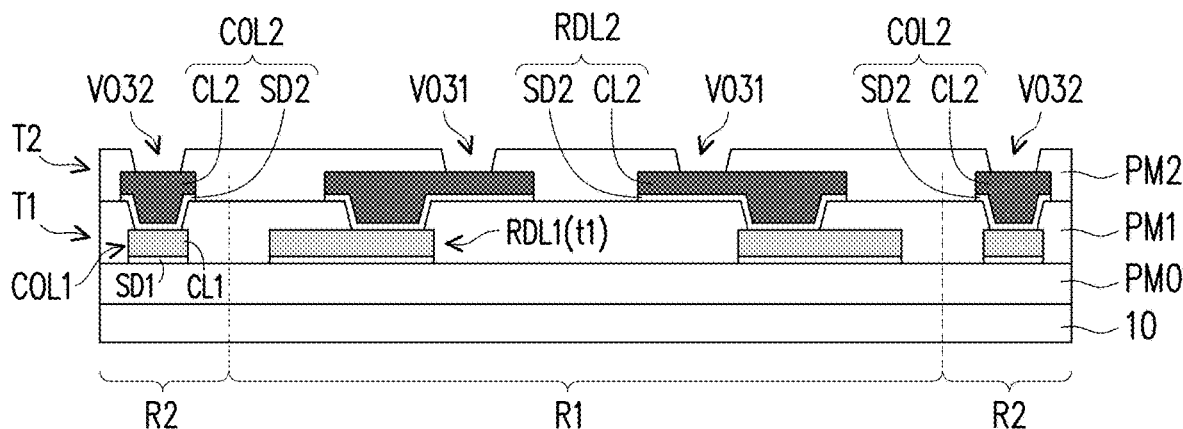

Referring to FIG. 2F, the dielectric layer PM2 is patterned to form via openings VO31 and VO32 in the dielectric layer PM2. In the region R1, the dielectric layer PM2 covers most of the top surface of the conductive layer CL2 of the redistribution layer RDL2; and the via opening VO31 exposes a small portion of the top surface of the conductive layer CL2 of the redistribution layer RDL2. In the region R2, the dielectric layer PM2 covers a small portion of or does not cover the top surface of the conductive layer CL2 of the compensation circuit layer COL2; and the via opening VO32 exposes most or all of the top surface of the conductive layer CL2 of the compensation circuit layer COL2. The ratio of the area of the top surface of the conductive layer CL2 of the redistribution layer RDL2 exposed by the via opening VO31 to the area of the top surface of the conductive layer CL2 of all the redistribution layers RDL2 is R31. The ratio of the area of the top surface of the conductive layer CL2 of the compensation circuit layer COL2 exposed by the via opening VO32 to the area of the top surface of the conductive layer CL2 of all the compensation circuit layers COL2 is R32. The ratio R32 is greater than the ratio R31. The ratio R31 is, for example, 1% to 49%. The ratio R32 is, for example, 50% to 100%.

Figure 2G:
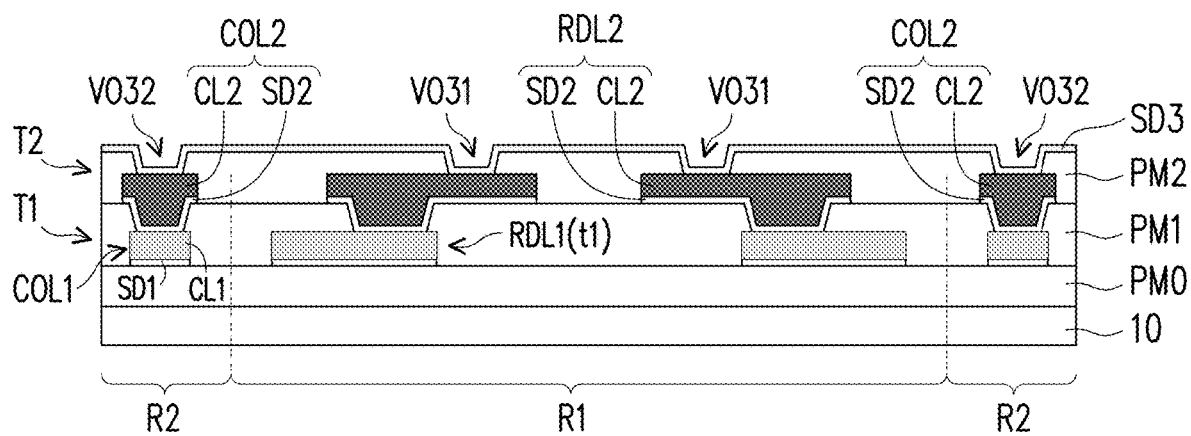

Next, referring to FIG. 2G, a seed layer SD3 is formed on the dielectric layer PM2 and in the via opening VO31 and the via opening VO32. The seed layer SD3 is a continuous layer extended from the region R1 to the region R2. The seed layer SD3 may be a single layer or a plurality of layers, such as a titanium/copper layer. The shape of the seed layer SD3 at the bottom surface of the via opening VO32 may be completely the same as, partially the same as, or completely different from the shape of the conductive layer CL2 in the region R2. The seed layer SD3 at the bottom surface of the via opening VO32 and the conductive layer CL2 below may be overlapped completely or partially. The seed layer SD3 at the bottom surface of the via opening VO32 may be a continuous layer or a discontinuous layer. The seed layer SD3 at the bottom surface of the via opening VO32 may have a single width, a plurality of widths, or a gradient width.

Figure 2H:
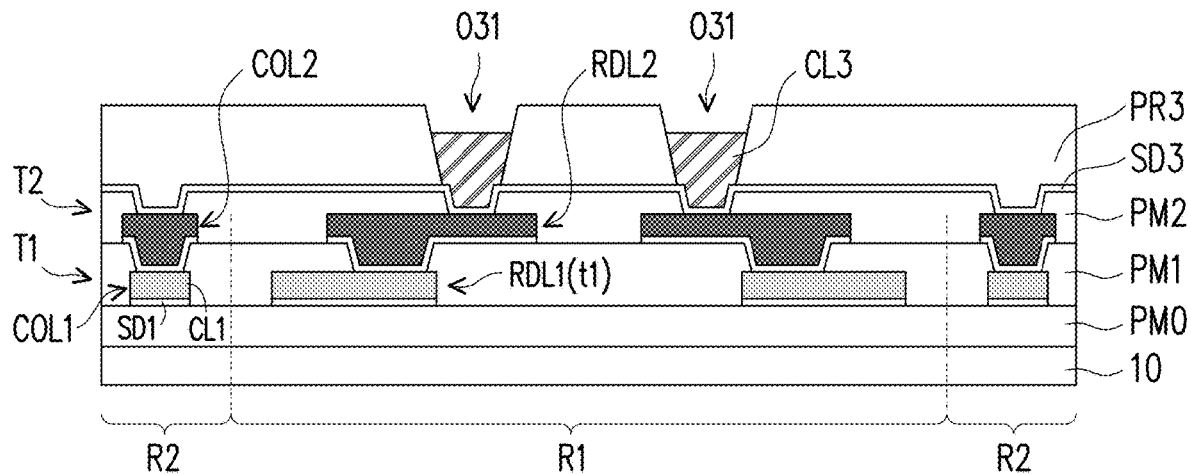

Next, referring to FIG. 2H, after the seed layer SD3 is formed, a patterned mask layer PR3 is formed on the seed layer SD3. The patterned mask layer PR3 is, for example, a patterned photoresist layer. The patterned hard mask layer PR3 has an opening O31. The opening O31 exposes the seed layer SD3 on the region R1. The seed layer SD3 on the region R2 is covered by the patterned mask layer PR3 without being exposed.

Then, a conductive layer CL3 is formed on the seed layer SD3 of the opening O31. The material of the conductive layer CL3 is, for example, copper or copper-aluminum alloy. The forming method of the conductive layer CL3 is, for example, an electroplating method. In the process of forming the conductive layer CL3, the conductive layer CL3 may be connected to the compensation circuit layer COL1 below via the seed layer SD3 and the compensation circuit layer COL2. Since the thicknesses of the compensation circuit layer COL2 and the compensation circuit layer COL1 are greater than the thickness of the seed layer SD3 and the resistances thereof are lower than the resistance of the seed layer SD3, the voltage difference between the central region and the edge region of the sample may be reduced, thereby reducing the thickness difference between the conductive layer CL3 formed in the central region and the conductive layer CL3 formed in the edge region.

Figure 2I:
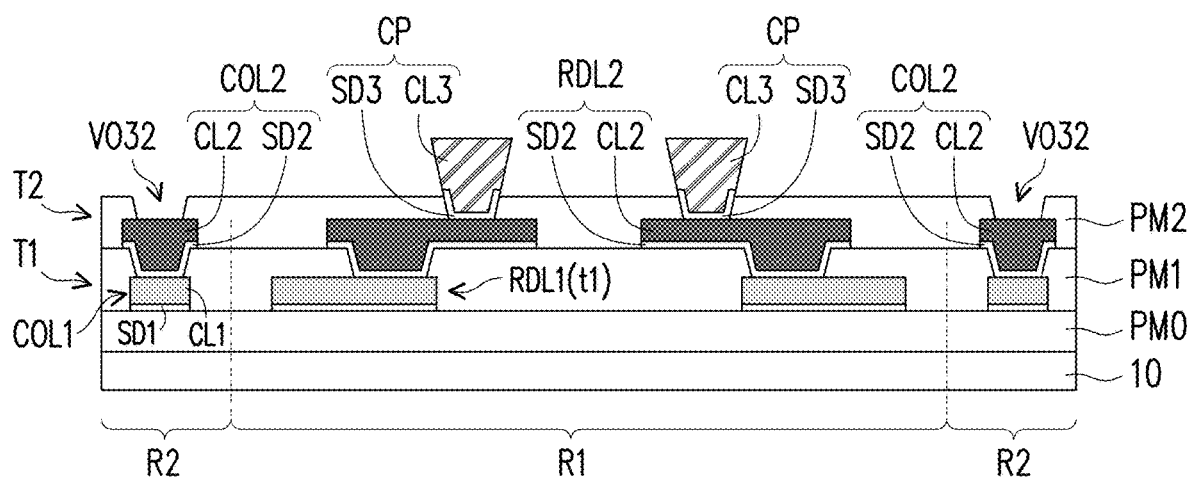
Figure 2I:
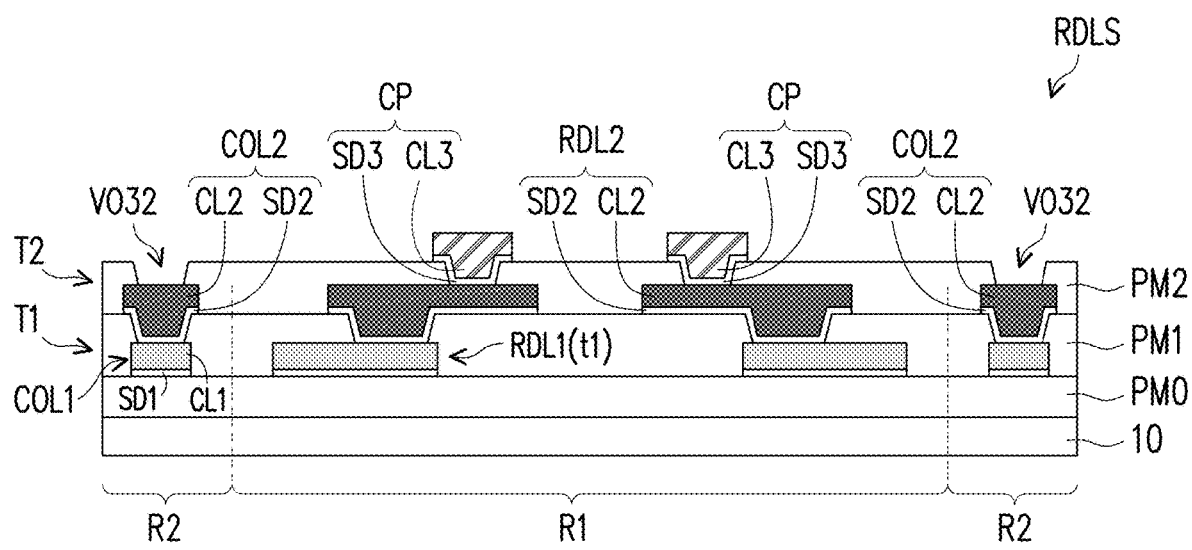

Referring to FIG. 2I, the patterned mask layer PR3 is removed. Then, the seed layer SD3 not covered by the conductive layer CL3 is removed to form the pads CP in the region R1, and the via opening VO32 in the region R2 exposes the conductive layer CL2 of the compensation circuit layer COL2. In some embodiments, the pads CP may be protruded beyond the top surface of the dielectric layer PM2 without covering the top surface of the dielectric layer PM2, which may also be called a bump, as shown in FIG. 2I. In some other embodiments, the pads CP may be protruded beyond the top surface of the dielectric layer PM2 and cover the top surface of the dielectric layer PM2, which may also be called an under-bump metal layer (UBM), as shown in FIG. 2I'.

Referring to FIG. 1A and FIG. 2B, in an embodiment of the disclosure, the compensation circuit layer COL1 and the redistribution layer RDL1 have substantially the same thickness. The compensation circuit layer COL2 and the redistribution layer RDL2 have substantially the same thickness. The resistances of the compensation circuit layers COL1 and COL2 are inversely proportional to the linewidths and thicknesses of the compensation circuit layers COL1 and COL2. When the linewidths and the thicknesses of the compensation circuit layers COL1 and COL2 are larger, the resistances of the compensation circuit layers COL1 and COL2 are lower. In addition, the linewidths of the compensation circuit layers COL1 and COL2 are related to the width ratios of the compensation circuit layers COL1 and COL2. For simplification, the compensation circuit layer COL1 is taken as an example to illustrate a width ratio $O_{cc}$ of the compensation circuit layer COL1.

Referring to FIG. 1A and FIG. 2B, a linewidth W of the compensation circuit layer COL1 is proportional to the width ratio $O_{cc}$ of the compensation circuit layer COL1. When the width ratio $O_{cc}$ is larger, the linewidth W of the compensation circuit layer COL1 is larger, and a resistance R of the compensation circuit layer COL1 is lower. When the width ratio $O_{cc}$ is smaller, the linewidth W of the compensation circuit layer COL1 is smaller, and a resistance R of the compensation circuit layer COL1 is larger. In some embodiments where the sample has a long side and a short side, the width ratio $O_{cc}$ of the compensation circuit layer COL1 is the sum of the widths W of all N number of compensation circuits of the long side of the compensation circuit layer COL1 divided by a length L of the long side of the sample. In some embodiments, all compensation circuits at the long side of the compensation circuit layer COL1 have the same width W, and the width ratio $O_{cc}$ may be defined as follows:

$$O_{cc} = W \times N / L$$

wherein

W is the width of each of the compensation circuits of the long side of the compensation circuit layer COL1;

N is the number of compensation circuits of the compensation circuit layer COL1; and L is the length of the long side of the sample.

The uniformity of the thickness distribution of the conductive layer CL2 formed by electroplating is related to the parameters of the compensation circuit layer COL1 below. The parameters of the compensation circuit layer COL1 include a thickness t and the width ratio $O_{cc}$ of the conductive layer CL1 of the compensation circuit layer COL1. The greater the thickness t of the conductive layer CL1 of the compensation circuit layer COL1, the smaller the reaction current difference between the central region and the edge region of the sample when the conductive layer CL2 is electroplated, and the smaller the voltage difference. Therefore, the thickness difference of the conductive layer CL2 formed in the central region and the edge region of the sample is also smaller. The greater the width ratio $O_{cc}$ of the compensation circuit layer COL1, the smaller the reaction current difference between the central region and the edge region of the sample when the conductive layer CL2 is electroplated, and the smaller the voltage difference, and the thickness difference of the conductive layer CL2 formed in the central region and the edge region of the sample is also smaller. In other words, the larger the product of the thickness t and the width ratio $O_{cc}$, the smaller the reaction current difference and the voltage difference between the central region and the edge region of the sample when the conductive layer CL2 is electroplated. Therefore, the thickness difference of the conductive layer CL2 formed in the central region and the edge region of the sample is smaller. In some embodiments, the width ratio $O_{cc}$ of the compensation circuit layer COL1 is 0.1% to 5%, and the thickness t thereof is 1 μm to 20 μm. The product of the thickness t and the width ratio $O_{cc}$ of the compensation circuit layer COL1 is between 0.001 μm and 1 μm. In some other embodiments, the product of the thickness t and the width ratio $O_{cc}$ of the compensation circuit layer COL1 is between 0.005 μm and 0.5 μm. In still some embodiments, the product of the thickness t and the width ratio $O_{cc}$ of the compensation circuit layer COL1 is between 0.08 μm and 0.16 μm.

Moreover, the uniformity of the thickness distribution of the conductive layer CL2 is also related to system parameters. The system parameters include the resistance of the seed layer SD2, the size of the sample, and the applied current. The greater the resistance of the seed layer SD2, the greater the voltage drop difference between the central region and the edge region of the sample when the conductive layer CL2 is electroplated, and the greater the thickness difference of the conductive layer CL2 formed in the central region and the edge region of the sample. The greater the size of the sample, the greater the voltage drop difference between the central region and the edge region of the sample when the conductive layer CL2 is electroplated, and the greater the thickness difference of the conductive layer CL2 formed in the central region and the edge region of the sample. The greater the applied current, the greater the voltage drop difference between the central region and the edge region, and the greater the thickness difference of the conductive layer CL2 formed in the central region and the edge region. Moreover, the greater the plating solution conductivity, the smaller the voltage drop difference between the central region and the edge region of the sample when the conductive layer CL2 is electroplated, and the smaller the thickness difference of the conductive layer CL2 formed in the central region and the edge region of the sample. In some embodiments, the resistance of the seed layer SD2 is between 0.1 Ω/□ and 10 Ω/□. The size of the sample is between 300 mm and 1300 mm. The applied current is 5 A to 10 A.

The uniformity of the thickness distribution of the conductive layer CL2 is also related to the parameters of the plating solution. The greater the plating solution conductivity, the smaller the voltage drop difference between the central region and the edge region of the sample when the conductive layer CL2 is electroplated, and the smaller the thickness difference of the conductive layer CL2 formed in the central region and the edge region of the sample. The plating solution conductivity is, for example, between 20 S/m and 50 S/m.

Figure 4:
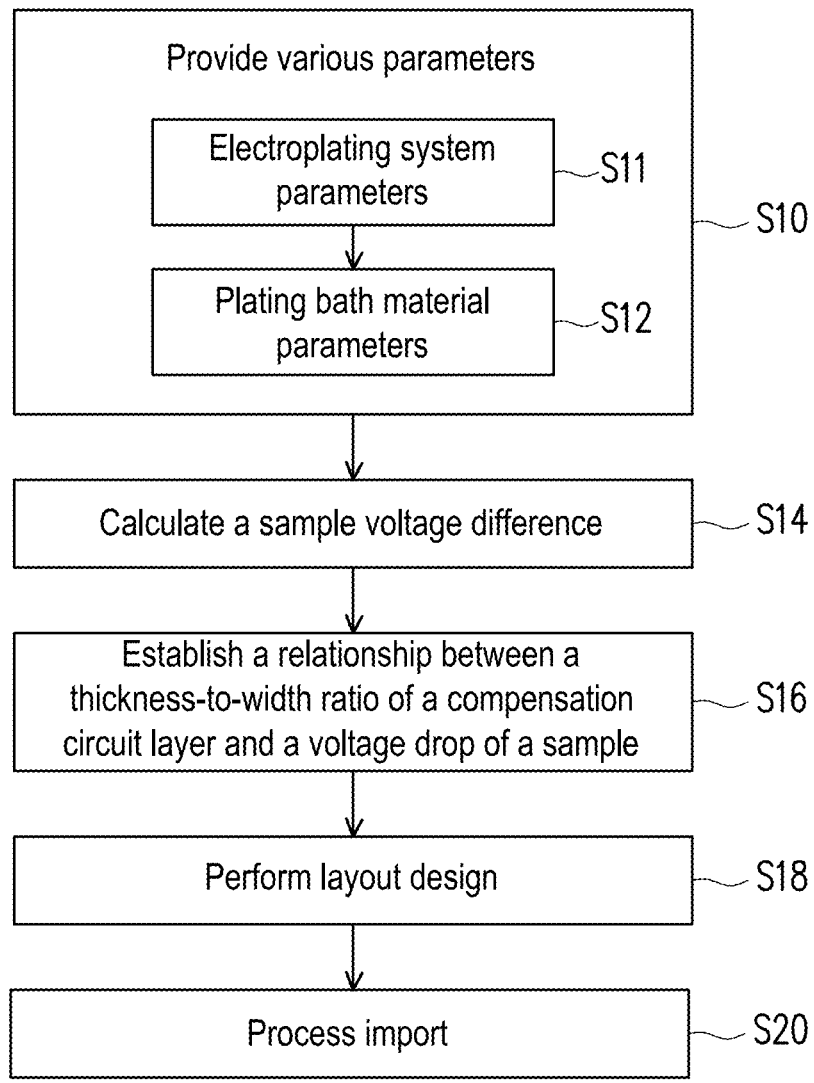
FIG. 4 is a flowchart of forming a compensation circuit layer according to an embodiment of the disclosure.

The thickness t of the conductive layer CL1 of the compensation circuit layer COL1 and the width ratio $O_{cc}$ of the compensation circuit layer COL1 of an embodiment of the disclosure may be formed according to the flowchart of FIG. 4.

Referring to FIG. 4, in step S10, various parameters are provided. Step S10 may include providing electroplating system parameters, as in step S11. The electroplating system parameters include cathode/anode distance, cathode sample size, resistance of the seed layer, and applied current (ASD), etc. In some embodiments, material parameters of the plating solution are further provided, as in step S12. The material parameters of the plating solution may include conductivity, Tafel slope, exchange current density, and so on. The Tafel slope refers to A in the Tafel equation. The Tafel equation gives the relationship between the reaction rate of the electrode reaction and the overpotential.

$$\eta = A \times \log_{10}\left(\frac{i}{i_0}\right)$$

wherein
η: overpotential
A: Tafel slope (V)
i: current density (A/m$^2$)
$i_0$: exchange current density (A/m$^2$)

In step S14, according to step S10, the sample voltage difference is calculated. The sample voltage difference refers to the voltage difference between the central region and the edge region.

In step S16, the relationship between the thickness t and the width ratio $O_{cc}$ of the compensation circuit layer COL1 and sample voltage drop is established. In some embodiments, the product of the thickness t and the width ratio $O_{cc}$ of the compensation circuit layer COL1 is between 0.001 μm and 1 μm, and the sample voltage difference can be controlled between 0.2 V and 0.026 V, so that the thickness difference of the electroplated conductive layer between the central region and the edge region is less than 20%.

In step S18, if there is a predetermined thickness of the compensation circuit layer COL1, the layout design can be performed according to the width ratio of the compensation circuit layer COL1 corresponding to the target thickness of the compensation circuit layer COL1.

In step S20, the designed layout is imported into the manufacturing process.

The forming method of the redistribution structure of an embodiment of the disclosure can be used in a chip-first process. The chip-first process means that the redistribution structure of an embodiment of the disclosure can be formed on a chip and an encapsulation layer only after the chip is encapsulated by the encapsulation layer. In other words, between the substrate 10 and the dielectric layer PM0 of FIG. 2A, an element or a chip and an encapsulation layer are further included. The element or the chip is electrically connected to the redistribution layer RDL1, but is electrically insulated from the compensation circuit layer COL1. The forming method of the redistribution structure of an embodiment of the disclosure can also be used in a post-chip process. The post-chip process refers to forming the redistribution structure of an embodiment of the disclosure on the substrate, and then forming the chip and the encapsulation layer on the redistribution structure, as shown in FIG. 5A to FIG. 5E and FIG. 6A to FIG. 6C.

In addition, after the redistribution structure RDLS and the die are bonded and packaged and after the cutting process is completed, depending on the position of the defined region R2, the compensation circuit layer COL2 and the compensation circuit layer COL1 can be completely kept, partially kept, or completely removed.

Figure 5A:
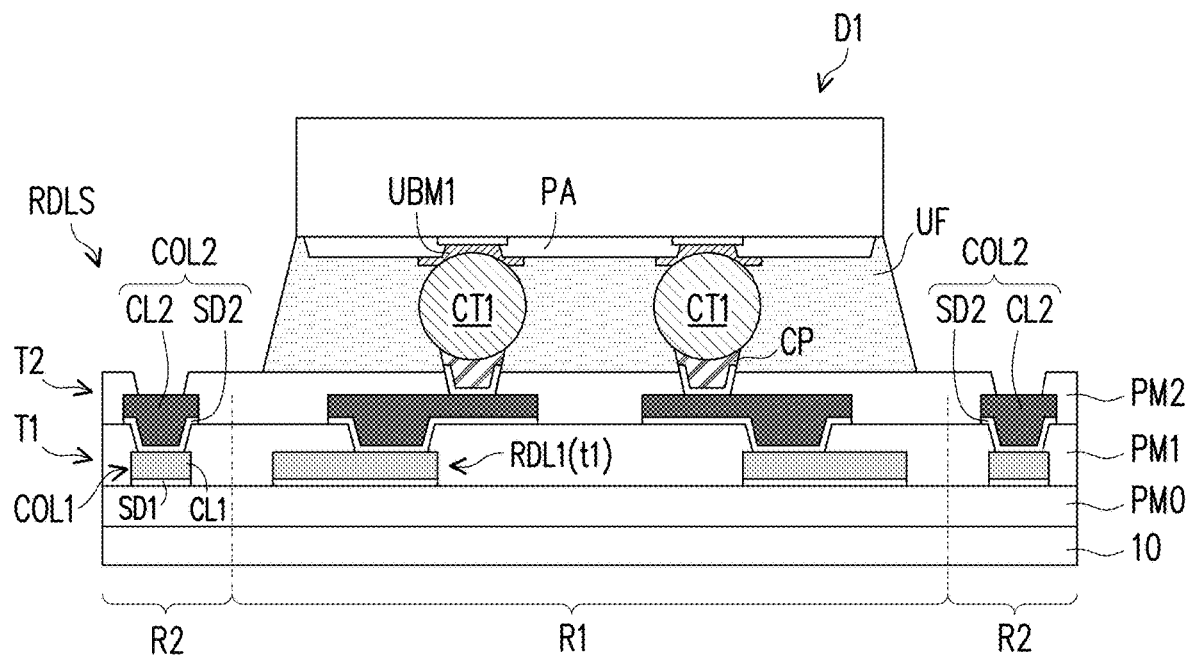
FIG. 5A to FIG. 5C are cross-sectional views of a manufacturing process of a package structure according to an embodiment of the disclosure.
Figure 6A:
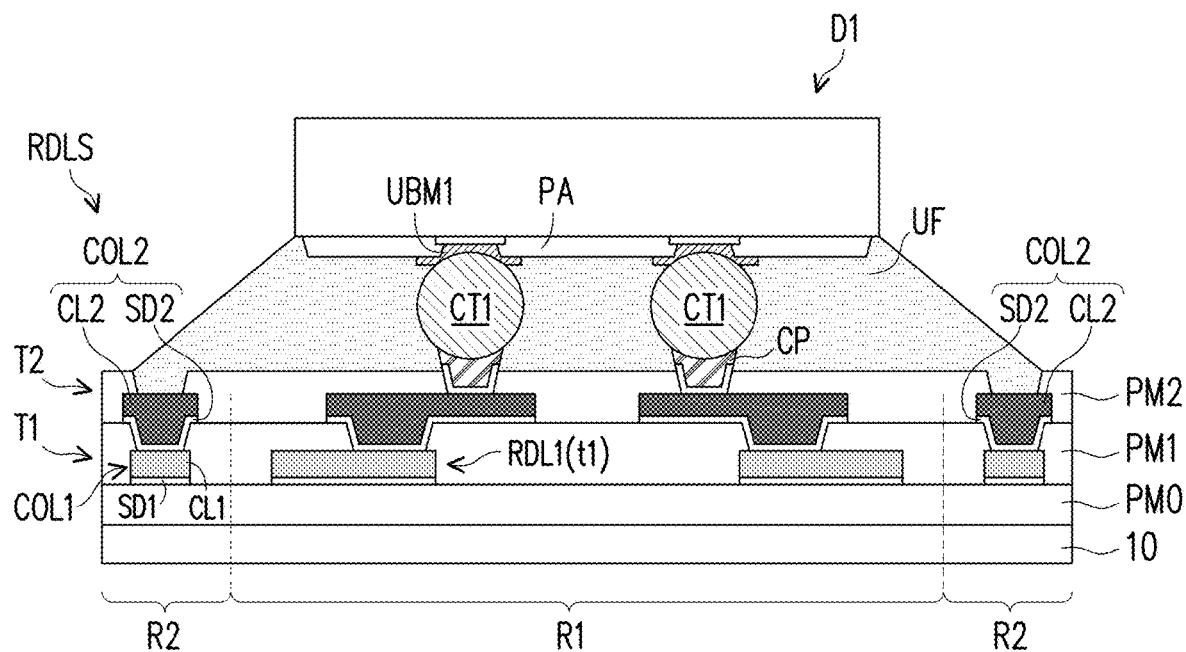
FIG. 6A to FIG. 6C are cross-sectional views of a manufacturing process of another package structure according to an embodiment of the disclosure.

Referring to FIG. 5A, a connection terminal CT1 on an under-ball metal layer UBM1 of a die D1 is bonded to the pads CP of the redistribution structure RDLS. Then, an underfill UF is filled between the dielectric layer PM2 and the die D1. The underfill UF may cover the under-ball metal layer UBM1 of the die D1, the connection terminal CT1, and a passivation layer PA, and even cover the sidewalls of the die D1. The underfill UF also covers the sidewalls of the pads CP and the top surface of the dielectric layer PM2. In some embodiments, the top surface of the compensation circuit layer COL2 is not covered by the underfill UF, as shown in FIG. 5A. In some other embodiments, the top surface of the compensation circuit layer COL2 is covered by the underfill UF, as shown in FIG. 6A.

Figure 5B:
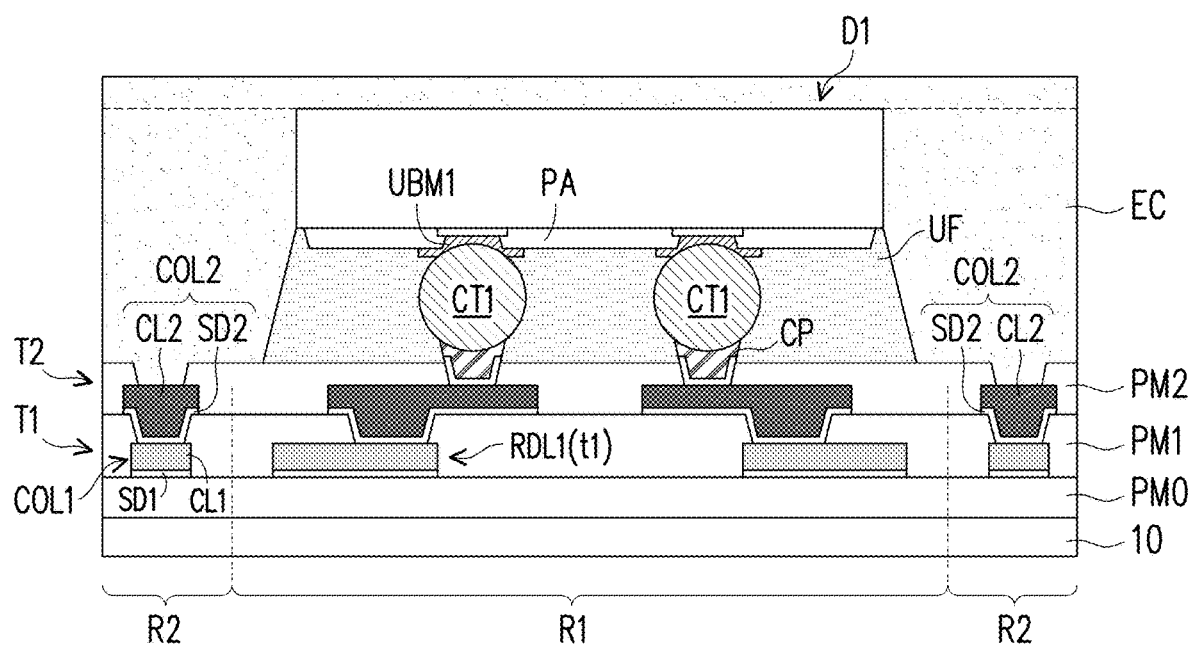
Figure 6B:
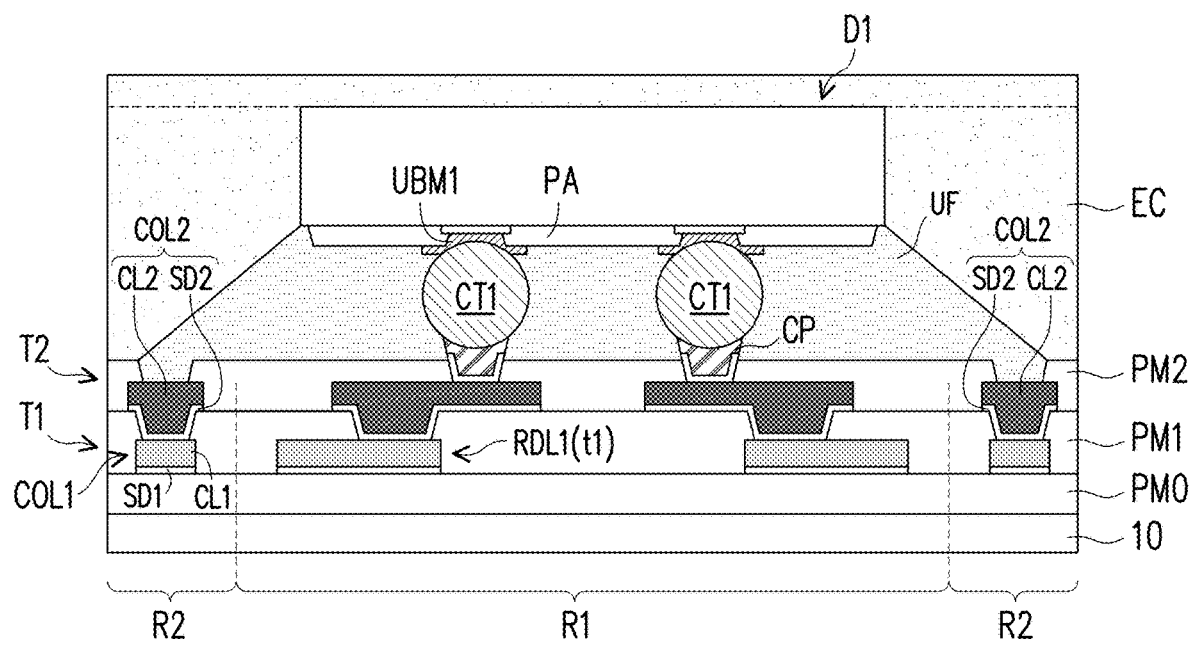

Referring to FIG. 5B and FIG. 6B, an encapsulation layer EC is formed on the pads CP of the redistribution structure RDLS to laterally encapsulate the sidewalls of the die D1. In some embodiments, the top surfaces of the dielectric layer PM2 and the compensation circuit layer COL2 are covered by the encapsulation layer EC, and the top surface of the die D1 is covered, as shown in FIG. 5B. In some other embodiments, the top surfaces of the dielectric layer PM2 and the compensation circuit layer COL2 are covered by the encapsulation layer EC, but the die D1 is exposed. The top surface of the encapsulation layer EC may be aligned with the die D1, as shown by the dotted line in FIG. 5B. In some embodiments, the top surface of the dielectric layer PM2 is covered by the encapsulation layer EC, and the top surface of the die D1 is covered, as shown in FIG. 6B. In some other embodiments, the top surface of the dielectric layer PM2 is covered by the encapsulation layer EC, but the die D1 is exposed. The top surface of the encapsulation layer EC may be aligned with the die D1, as shown by the dotted line in FIG. 6B.

Figure 5C:
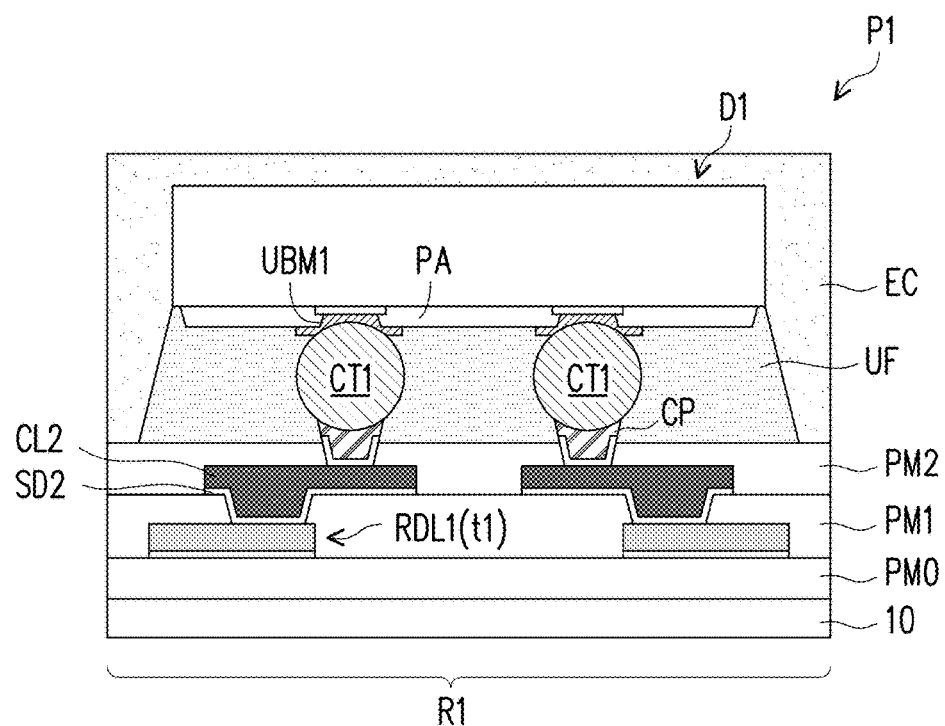
Figure 5D:
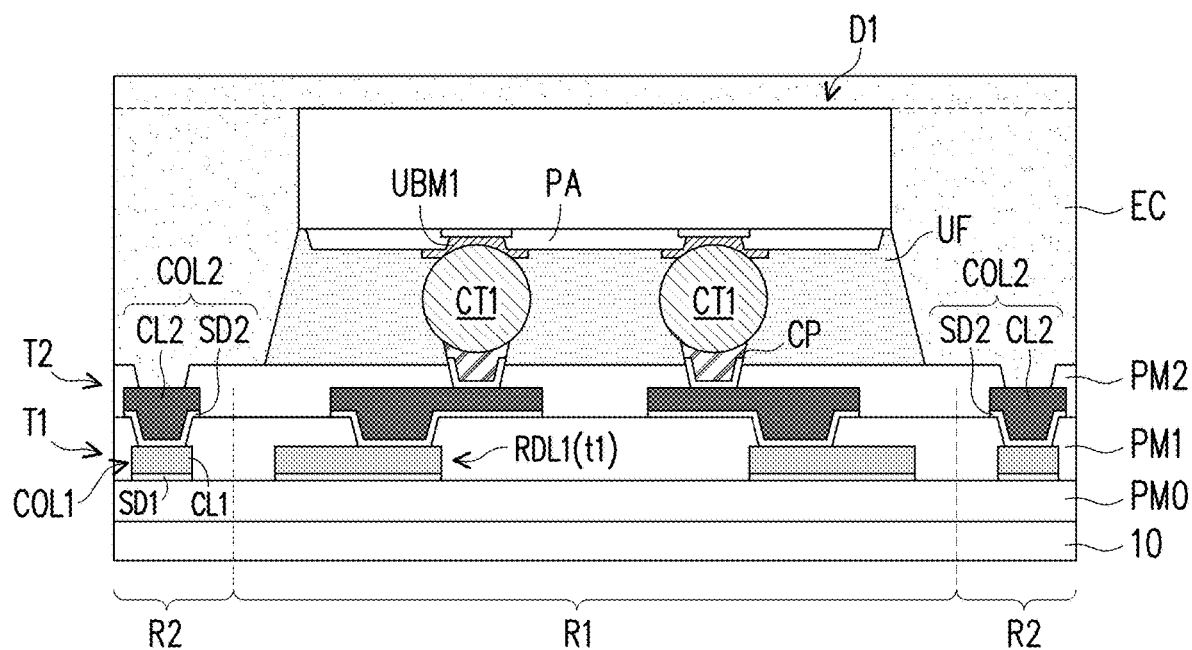
FIG. 5D and FIG. 5E are cross-sectional views of some other package structures according to embodiments of the disclosure.
Figure 5E:
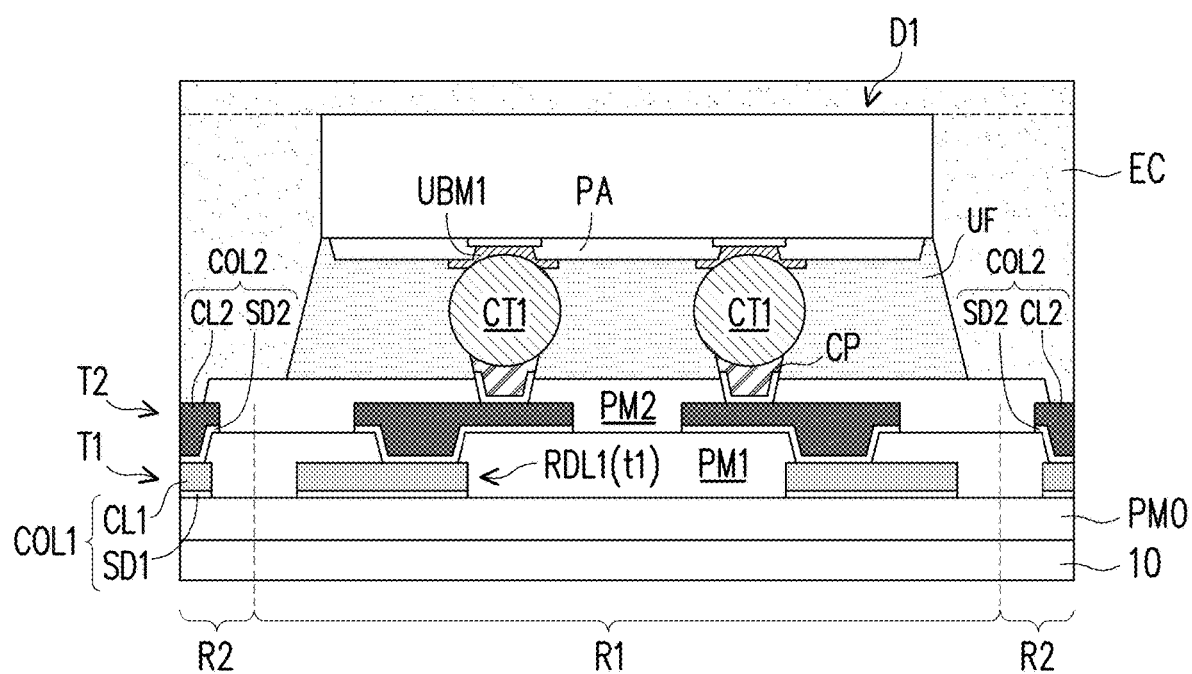
Figure 6C:
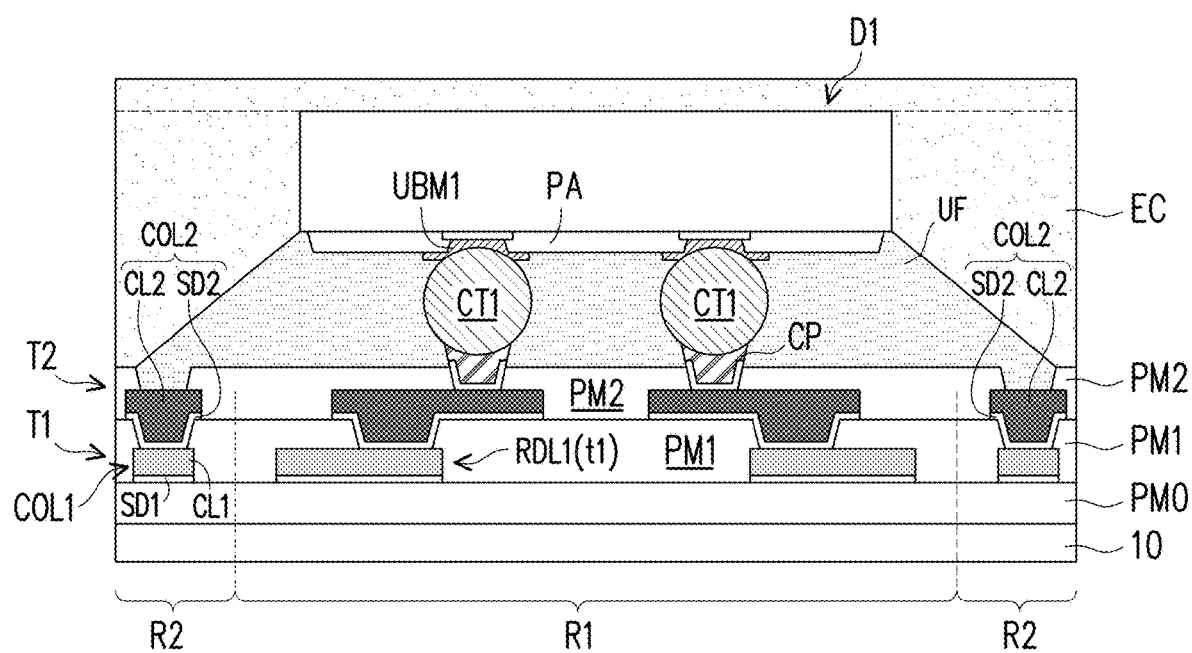

Please refer to FIG. 5C, FIG. 5D, FIG. 5E, and FIG. 6C. A cutting process is performed to form a plurality of packaging structures P1 separated from each other. In some embodiments, the compensation circuit layer COL2 is removed, so that the packaging structures P1 do not contain the compensation circuit layers COL1 and COL2, as shown in FIG. 5C. In some other embodiments, the compensation circuit layers COL1 and COL2 are kept, so that the packaging structures P1 contain the compensation circuit layer COL2, as shown in FIG. 5D and FIG. 6C. In other embodiments, the compensation circuit layers COL1 and COL2 are partially removed, so that the packaging structures P1 contain a portion of the compensation circuit layers COL1 and COL2, as shown in FIG. 5E.

In addition, the substrate 10 may be removed during the manufacturing process or remain in the final packaging structures P1.

Experimental Example 1 to Experimental Example 4

A 3.5-generation (G3.5) panel sample was provided. The size of the sample was 600 mm×720 mm. A network compensation circuit layer and a redistribution layer having different thicknesses and different width ratios were formed on the surface of the sample, and a dielectric layer was formed on the compensation circuit layer and the redistribution layer. In addition, vias exposing the compensation circuit layer and the redistribution layer were formed in the dielectric layer. A titanium/copper seed layer was formed in the vias and on the dielectric layer, and the sheet resistance of the seed layer thereof was 1 Ω/□. Then, a copper plating process was performed. The copper plating process was performed using an electroplating solution having a conductivity of 35 S/m, a Tafel slope of 1.5, and an exchange current density $i_0$ of 0.3 A/m², and the anode current output was set to 70 A (that is, full-plate electroplating sample 1.6 ASD), and the overvoltage was 0.45 V. The results are shown in Table 1.

Comparative Example 1

The copper plating process was performed in a similar manner to Experimental example 1. However, before the copper plating process, there was a redistribution layer on the surface of the sample, but no compensation circuit layer. The results are shown in Table 1.

The results in Table 1 show that: for a 3.5-generation sample not provided with a compensation circuit layer, the resulting voltage difference was 0.854 V (Comparative example 1). For a 3.5-generation sample provided with a compensation circuit layer, the resulting voltage difference could be reduced from 0.854 V to 0.401 V (Experimental example 1). The thickness t of the compensation circuit layer was 10 μm, the width ratio $O_{cc}$ was 1%, the resulting voltage difference was 0.285 V, and the resulting thickness difference was less than 20% (Experimental example 2). The thickness t of the compensation circuit layer was 10 μm, the width ratio $O_{cc}$ was 2%, the resulting voltage difference was 0.199 V, and the resulting thickness difference was less than 10% (Experimental example 3).

Experimental Example 5 to Experimental Example 9

A 2.5-generation (G2.5) sample was provided. The size of the sample was 370 mm×470 mm. A network compensation circuit layer and a redistribution layer having different thicknesses but the same width ratio were formed on the surface of the sample, and a dielectric layer was formed on the compensation circuit layer and the redistribution layer. In addition, vias exposing the compensation circuit layer and the redistribution layer were formed in the dielectric layer. A titanium/copper seed layer was formed in the vias and on the dielectric layer, and the sheet resistance of the seed layer thereof was 0.2 Ω/□. Then, a copper plating process was performed. The copper plating process was performed using an electroplating solution with a conductivity of 35 S/m, a Tafel slope of 1.5, and an exchange current density $i_0$ of 0.3 A/m², and the anode current output was set to 25 A and the overvoltage was set to 0.45 V. The results are as shown in Table 2.

Comparative Example 2

The copper plating process was performed in a similar manner as in Experimental example 5. However, before the copper plating process, there was a redistribution layer on the surface of the sample, but no compensation circuit layer. The results are as shown in Table 2.

TABLE 1

| Experimental example | Plating bath material parameters | Compensation circuit layer | Resistance value of electroplating sample | Voltage difference of electroplating sample | Thickness difference |
|---|---|---|---|---|---|
| Experimental example 1 | Conductivity σ = 35 S/m, | Yes, thickness 5 μm, width ratio 1% | 0.199 Ω | 0.401 V | 19.5% |
| Experimental example 2 | Tafel slope 1.5 V, | Yes, thickness 10 μm, width ratio 1% | 0.099 Ω | 0.285 V | 14.6% |
| Experimental example 3 | Exchange current | Yes, thickness 10 μm, width ratio 2% | 0.049 Ω | 0.199 V | 9.9% |
| Experimental example 4 | density $i_0$ = 0.3 A/m² | Yes, thickness 15 μm, width ratio 2% | 0.033 Ω | 0.099 V | 5.2% |
| Comparative example 1 | | None | 1 Ω/□ | 0.854 V | 21.2% |

TABLE 2

|  | Comparative example 2 | Experimental example 5 | Experimental example 6 | Experimental example 7 | Experimental example 8 | Experimental example 9 |
|---|---|---|---|---|---|---|
| Ti/Cu seed layer | Yes | Yes | Yes | Yes | Yes | Yes |
| Compensation circuit thickness (m) | — | 1.9E−7 | 1E−6 | 2E−6 | 3E−6 | 5E−6 |
| Equivalent sheet resistance ($\Omega/\square$) | 0.2 | 0.0347 | 0.009 | 0.0048 | 0.0033 | 0.0019 |
| Maximum voltage difference (V) | 0.238 | 0.093 | 0.0258 | 0.0136 | 0.012 | 0.0096 |

The results in Table 2 show that: for a 2.5-generation sample not provided with a compensation circuit layer, the resulting voltage difference was 0.238 V (Comparative example 2). For a 2.5-generation sample provided with a compensation circuit layer, the resulting voltage difference could be reduced from 0.238 V to 0.0096 V.

In an embodiment of the disclosure, a compensation circuit layer is formed around the lower redistribution layer, so that the seed layer of the upper redistribution layer formed subsequently may be electrically connected to the compensation circuit layer. In comparison to the seed layer, since the compensation circuit layer has a greater thickness and a lower resistance, a greater voltage drop produced due to the central region being farther from the electrode fixture and the seed layer having greater resistance may be avoided. In other words, the compensation circuit layer may reduce the voltage difference between the central region and the edge region of the sample during the electroplating process, thereby improving the thickness uniformity of the conductive layer in the central region and the edge region.

Based on the above, the embodiments of the disclosure may solve the issue of uneven thickness distribution of the plating layer during large-area electroplating via a compensation circuit layer.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A redistribution structure, comprising:
a first redistribution layer and a first compensation circuit layer electrically insulated from each other, wherein the first compensation circuit layer surrounds the first redistribution layer;
a first dielectric layer on the first redistribution layer and the first compensation circuit layer; and
a second redistribution layer and a second compensation circuit layer are electrically insulated from each other and are disposed on the first dielectric layer, wherein the second compensation circuit layer surrounds the second redistribution layer, the second compensation circuit layer is connected to the first compensation circuit layer, and the second redistribution layer is connected to the first redistribution layer, wherein a product of a thickness of the first compensation circuit layer and a width ratio of the first compensation circuit layer is between 0.001 μm and 1 μm, and the width ratio of the first compensation circuit layer is a ratio of a sum of widths of all of the compensation circuits at a long side of the first compensation circuit layer to a length of the long side of the first compensation circuit layer.

2. A redistribution structure, comprising:
a first redistribution layer and a first compensation circuit layer electrically insulated from each other, wherein the first compensation circuit layer surrounds the first redistribution layer;
a first dielectric layer on the first redistribution layer and the first compensation circuit layer; and
a second redistribution layer and a second compensation circuit layer are electrically insulated from each other and are disposed on the first dielectric layer, wherein the second compensation circuit layer surrounds the second redistribution layer, the second compensation circuit layer is connected to the first compensation circuit layer, and the second redistribution layer is connected to the first redistribution layer,
wherein an overlap ratio of a bottom surface of the second compensation circuit layer and a top surface of the first compensation circuit layer is greater than an overlap ratio of a bottom surface of the second redistribution layer and a top surface of the first redistribution layer.

3. The redistribution structure of claim 1, wherein the first compensation circuit layer and the second compensation circuit layer have a regular pattern.

4. The redistribution structure of claim 1, wherein the first compensation circuit layer has a continuous network structure, and the second compensation circuit layer has a continuous network structure.

5. The redistribution structure of claim 1, wherein the first compensation circuit layer has a continuous network structure, and the second compensation circuit layer has a discontinuous network structure.

6. The redistribution structure of claim 1, wherein the first compensation circuit layer and the second compensation circuit layer are disposed in a cutting region or around the cutting region.

7. A redistribution structure, comprising:
a first redistribution layer and a first compensation circuit layer electrically insulated from each other, wherein the first compensation circuit layer surrounds the first redistribution layer;
a first dielectric layer on the first redistribution layer and the first compensation circuit layer;
a second redistribution layer and a second compensation circuit layer are electrically insulated from each other and are disposed on the first dielectric layer, wherein the second compensation circuit layer surrounds the second redistribution layer, the second compensation circuit layer is connected to the first compensation circuit layer, and the second redistribution layer is connected to the first redistribution layer;
a second dielectric layer on the second redistribution layer and exposing a top surface of the second compensation circuit layer; and a pad located on the second dielectric layer and connected to the second redistribution layer, wherein the second redistribution layer is connected to a chip via the pad, and the chip is electrically insulated from the first compensation circuit layer and the second compensation circuit layer.

8. The redistribution structure of claim 7, wherein a top surface of the second dielectric layer, the top surface of the second compensation circuit layer, and sidewalls of the chip are covered by an encapsulation layer.

9. The redistribution structure of claim 7, wherein a top surface of the second dielectric layer and the top surface of the second compensation circuit layer are covered by an underfill.

10. The redistribution structure of claim 2, wherein the first compensation circuit layer and the second compensation circuit layer have a regular pattern.

11. The redistribution structure of claim 2, wherein the first compensation circuit layer has a continuous network structure, and the second compensation circuit layer has a continuous network structure.

12. The redistribution structure of claim 2, wherein
wherein the first compensation circuit layer has a continuous network structure, and the second compensation circuit layer has a discontinuous network structure.

13. The redistribution structure of claim 2, wherein the first compensation circuit layer and the second compensation circuit layer are disposed in a cutting region or around the cutting region.

14. A redistribution structure, comprising:
a first redistribution layer and a first compensation circuit layer electrically insulated from each other, wherein the first compensation circuit layer surrounds the first redistribution layer;
a first dielectric layer on the first redistribution layer and the first compensation circuit layer; and
a second redistribution layer and a second compensation circuit layer are electrically insulated from each other and are disposed on the first dielectric layer, wherein the second compensation circuit layer surrounds the second redistribution layer, the second compensation circuit layer is connected to the first compensation circuit layer, and the second redistribution layer is connected to the first redistribution layer,
wherein the first compensation circuit layer has a continuous network structure, and the second compensation circuit layer has a discontinuous network structure.

15. The redistribution structure of claim 14, wherein the first compensation circuit layer and the second compensation circuit layer are disposed in a cutting region or around the cutting region.

* * * * *